(12) United States Patent
Hiraka et al.

(10) Patent No.: US 6,366,564 B1
(45) Date of Patent: Apr. 2, 2002

(54) DIPLEXER DUPLEXER AND TWO-CHANNEL MOBILE COMMUNICATIONS EQUIPMENT

(75) Inventors: Masahiro Hiraka, Ikoma; Hidenori Katsumura, Kobe; Ryuichi Saito, Kadoma; Hiroshi Kushitani, Izumisano; Naoki Yuda, Hirakata; Shigeo Hurukawa, Osaka; Suzushi Kimura, Toyonaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/077,254

(22) PCT Filed: Sep. 24, 1997

(86) PCT No.: PCT/JP97/03381

§ 371 Date: May 26, 1998

§ 102(e) Date: May 26, 1998

(87) PCT Pub. No.: WO98/13932

PCT Pub. Date: Apr. 2, 1998

(30) Foreign Application Priority Data

Sep. 26, 1996 (JP) .............................. 8-254130
Apr. 25, 1997 (JP) .............................. 9-108788
Jul. 14, 1997 (JP) .............................. 9-188071

(51) Int. Cl.[7] .............................. H04B 1/56; H01P 1/15
(52) U.S. Cl. .......................... 370/275; 455/78; 333/103
(58) Field of Search .................. 370/275, 278, 370/286, 290, 291, 297; 455/78, 83; 333/1.1, 101, 103, 110, 132, 185, 219.1, 242

(56) References Cited

U.S. PATENT DOCUMENTS

| 5,304,967 A | * | 4/1994 | Hayashi ...................... 333/206 |
| 5,594,394 A | * | 1/1997 | Sasaki et al. ................ 333/103 |
| 5,634,200 A | * | 5/1997 | Kitakubo et al. ............. 455/82 |
| 5,945,887 A | * | 8/1999 | Makino et al. .............. 333/1.1 |
| 6,066,993 A | * | 5/2000 | Yamaoto et al. ............ 333/103 |
| 6,097,268 A | * | 8/2000 | Watanabe et al. ........... 333/132 |

FOREIGN PATENT DOCUMENTS

| JP | 64-29131 | 1/1989 |
| JP | 4-301901 | 10/1992 |
| JP | 5-55811 | 3/1993 |
| JP | 8-204530 | 8/1996 |
| JP | 8-321738 | 12/1996 |

OTHER PUBLICATIONS

Japanese language search report for Int'l Appln. No. PCT/JP97/03381 dated Jan. 20, 1998.

* cited by examiner

Primary Examiner—Chau Nguyen
Assistant Examiner—Andy Lee
(74) Attorney, Agent, or Firm—Ratner & Prestia, PC

(57) ABSTRACT

A diplexer employed in mobile communications equipment such mobile phones which can divide signals into two channels with a simple configuration without interfering the other band. In this diplexer, an inductor 105 is connected between a π-type three-stage one polar low-pass filter 115 and a common terminal 113 as a first matching circuit, and a capacitor 106A is connected between a one polar band-pass filter 116 and a common terminal 113 as a second matching circuit so that interference with the other band can be prevented and the higher harmonics can be sufficiently attenuated with simple configuration.

14 Claims, 7 Drawing Sheets

DIPLEXER DUPLEXER AND TWO-CHANNEL MOBILE COMMUNICATIONS EQUIPMENT

This Application is a U.S. National Phase Application of PCT International Application PCT/JP976/03381.

FIELD OF THE INVENTION

The present invention relates to the field of diplexers, duplexers, and two-channel mobile communications equipment employed in mobile communications, particularly in mobile phones.

BACKGROUND OF THE INVENTION

Diplexers employed in mobile communications generally have the configuration shown in FIGS. 9 to 11. Specifically, a diplexer of the prior art has a circuit shown in FIG. 9 which comprises a low-pass filter and high-pass filter formed in a low-dielectric ceramic material as shown in FIG. 10.

In FIG. 10, a conductive layer 24 is formed on a low-dielectric layer 16i as a shield electrode, followed by a laminated low-dielectric layer 16h. Inductor electrodes 23a and 23b are formed on this low-dielectric layer 16h, followed by a laminated low-dielectric layer 16g. A capacitor electrode 22 is formed on this low-dielectric layer 16g, followed by a laminated low-dielectric layer 16f. A capacitor electrode 21 is formed on this low-dielectric layer 16f, followed by a laminated low-dielectric layer 16e. A conductive layer 20 is formed on this low-dielectric layer 16e as a shield electrode, followed by a laminated low-dielectric layer 16d. Capacitor electrodes 19a and 19b are formed on this low-dielectric layer 16d, followed by a laminated low-dielectric layer 16c. An inductor electrode 18 is formed on this low-dielectric layer 16c, followed by a laminated low-dielectric layer 16b. An inductor electrode 17 is formed on this low-dielectric layer 16b, followed by a laminated low-dielectric layer 16a. In the low-dielectric layer 16b, a via hole 25 is formed to create an electrical connection between the inductor electrodes 17 and 18.

Next, FIG. 11 shows a perspective of the diplexer of the prior art. The conductive layers 20 and 24 are connected with end electrodes 26b, 26d, 26f, and 26g at the side of the dielectric substance to form a shielded electrode by grounding the end electrodes 26b, 26d, 26f, and 26g.

Also, as shown in FIG. 9, a first terminal 907 is formed by connecting an end electrode 26a and the inductor electrode 17 at the side of the dielectric substance, and a first inductor 902 is also formed by connecting the inductor electrodes 17 and 18 through the via hole 25. The end electrode 26a is also connected to the capacitor electrode 19a at the side of the dielectric substance to form a first capacitor 901 between the conductive layer 20. A common terminal 908 is formed by connecting the inductor electrode 18 and capacitor electrode 21 to an end electrode 26c at the side of the dielectric substance. The end electrode 26c is further connected to the capacitor electrode 19b at the side of the dielectric substance to form a second capacitor 903 between the conductive layer 20. This is how a low-pass filter 910 is configured.

Next, a third capacitor 905 is formed with the capacitor electrode 22 facing the capacitor electrode 21 connected to the end electrode 26c. The end electrode 26c is also connected to the inductor electrode 23b at the side of the dielectric substance, and a second inductor 904 is formed by connecting the other end of the inductor electrode 23b to the end electrode 26g. In the same way, the capacitor electrode 22 is connected to the inductor electrode 23a at the side of the dielectric substance, and a third inductor 906 is formed by connecting the other end to the end electrode 26f. The capacitor electrode 23 is also connected to the end electrode 26e at the side of the dielectric substance to form a second terminal 909. This is how a high-pass filter 911 is configured.

Attenuation of the low-pass filter 910 is increased in the passband frequency of the high-pass filter 911, and attenuation of the high-pass filter 911 is increased in the passband frequency of the low-pass filter 910 to ensure mutual isolation.

However, since the number of mobile communications users has rapidly increased in recent years, the trend is towards enabling the use of a system employing two different frequency bands in one piece of communications equipment to make it more likely to secure a communications channel. In this case, a device for dividing two bands is required. If the diplexer of the prior art which comprises a low-pass filter and high-pass filter formed in a low-dielectric ceramic material is used for realizing such a system, due to structural limitations, the higher harmonics cannot be removed. In addition, the size will be larger due to design restrictions.

SUMMARY OF THE INVENTION

The present invention offers a small device for dividing two bands and also removing the higher harmonics.

The present invention has a configuration comprising a formed low-dielectric layer and high-dielectric layer. A low-pass filter and an inductor as a matching circuit for the low-pass filter are formed in the low-dielectric layer, and a band-pass filter and a capacitor as a matching circuit for the band-pass filter are formed in the high-dielectric layer.

This configuration allows the present invention to be embodied in a small device which can divide signals input to a common terminal into two bands and remove the higher harmonics.

DESCRIPTION OF THE PREFERRED EMBODIMENTS

First Exemplary Embodiment

Figure 1:
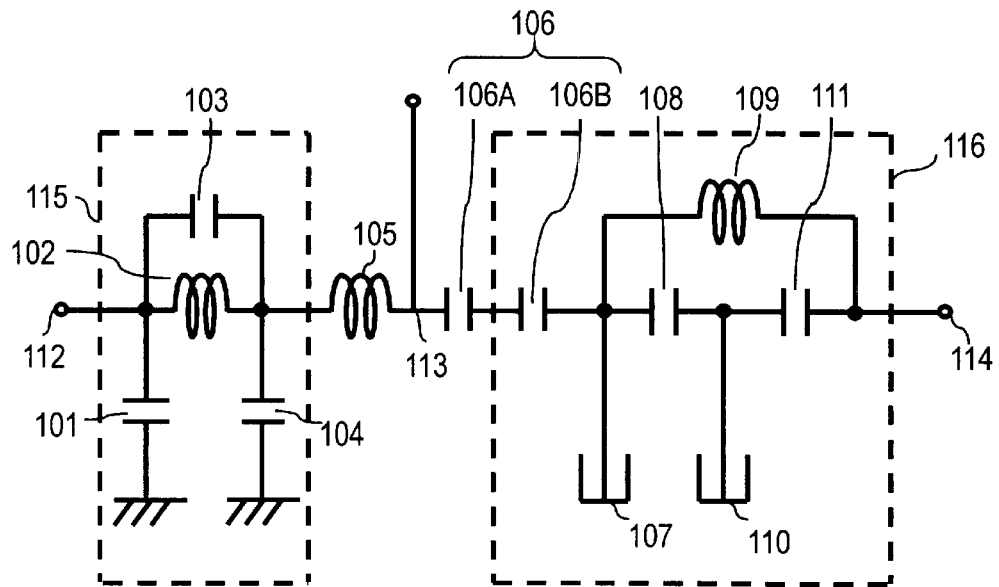
FIG. 1 is a circuit showing the configuration of a diplexer in a first exemplary embodiment of the present invention.

FIG. 1 shows a circuit diagram of a diplexer in a first exemplary embodiment of the present invention. In FIG. 1, one end of a first capacitor 101, one end of a first inductor 102, and one end of a second capacitor 103 are connected to a first terminal 112, and the other end of the first capacitor 101 is grounded. The other end of the first inductor 102 and the other end of the second capacitor 103 are connected to one end of a third capacitor 104 and one end of a second inductor 105. The other end of the third capacitor 104 is grounded. The other end of the second inductor 105 is connected to one end of a fourth capacitor 106A in series, and it is also connected to a common terminal 113. The other end of a fourth capacitor 106B is connected to a first quarter wavelength resonator 107, one end of a fifth capacitor 108, and one end of a third inductor 109. The other end of the fifth capacitor 108 is connected to a second quarter wavelength resonator 110 and one end of a sixth capacitor 111. The other end of the third inductor 109 is connected to the other end of the sixth capacitor 111 to connect to a second terminal 114.

To simplify the description, the fourth capacitors 106A and 106B connected in series are represented by one capacitor, which is a fourth capacitor 106 in the following explanation.

The operation of the diplexer as configured above is now explained.

The first capacitor 101, first inductor 102, second capacitor 103, and third capacitor 104 form a π-type three-stage one polar low-pass filter 115. The first band is set to a passband, and an attenuation pole is formed in the second band. The fourth capacitor 106, first quarter wavelength resonator 107, fifth capacitor 108, third inductor 109, second quarter wavelength resonator 110, and sixth capacitor 111 form two-stage one polar band-pass filter 116. The second band is set to a passband and an attenuation pole is formed in the first band.

In a circuit from the common terminal 113 to the second terminal 114, impedance of the fourth capacitor 106 connected in series can be defined as $1/(\omega C)$, where C is the capacity. Since the first quarter wavelength resonator 107 can be equivalently replaced with a parallel resonance circuit of a capacitor and inductor with one end grounded, then impedance of the capacitor and inductor can be defined respectively as $\omega C$ and $1/(\omega L)$ (L is inductance of the inductor). This makes impedance of the fourth capacitor 106 higher and impedance of the first quarter wavelength resonator 107 lower as the frequency lowers.

Accordingly, in the first band, the band-pass filter 116 shows capacitive characteristics, and functions as a capacitor connected between the common terminal 113 and ground. With the second inductor 105 connected as the first matching circuit, an area between the first terminal 112 and common terminal 113 becomes equivalent to a π-type five-stage low-pass filter.

This allows to sufficiently attenuate signals in the first band input to the common terminal 113 at the second terminal 114 side, and the most of such signals are output to the first terminal 112 side. In addition, the higher harmonics is sufficiently attenuated by the low-pass filter 115. On the contrary, signals in the first band input to the first terminal 112 do not pass through to the second terminal 114 side, and are output to the common terminal 113.

Next, the operation between the common terminal 113 and second terminal 114 is explained. In a circuit between the common terminal 113 and first terminal 112, impedance of the second inductor 105 connected in series can be defined as $\omega L$ where L is inductance. Impedance of the third capacitor 104 connected before the ground can be defined as $1/(\omega C)$ (C is capacitance of the capacitor). Thus, impedance of the second inductor 105 becomes higher and impedance of the third capacitor 104 becomes lower as the frequency increases. Accordingly, the low-pass filter 115 shows inductivity in the second band, and functions as an inductor connected between the common terminal 113 and ground.

Here, suppose that a capacitor is connected in series between the common terminal 113 and pass-band filter 116, and an inductor is connected between the other end of the capacitor, contact point of the band-pass filter 116, and ground. This inductor then is equivalent to a negative capacitor connected between the ground, and it can also be replaced with the first quarter wavelength resonator 107 by making the resonator length shorter. Furthermore, since input/output connection of the band-pass filter 116 is capacitive coupling, the capacitor can be formed with a single element as composite capacitance.

As a result, the circuit shown in FIG. 1 can be configured to include an inductor connected between the capacitor, which is connected in series between the common terminal 113 and band-pass filter 116, and the ground by adjusting the fourth capacitor 106 and the resonator length of the first quarter wavelength resonator 107.

Therefore, in the second band, between the common terminal 113 and the second terminal 114, the inductor connected to the ground, capacitor connected in series, and inductor connected to the ground are configured equivalently. This circuit functions as a matching circuit in the band lower than the passband, which is commonly known as a phase shifter of the π-type high-pass filter.

This allows sufficient signal attenuation in the second band input to the common terminal 113 at the first terminal 112 side, and most of such signals are output to the second terminal 114 side. The higher harmonics are also sufficiently attenuated by the pass-band filter 116. On the contrary, signals in the second band input to the second terminal 114 do not pass through to the first terminal 112 side, and are output to the common terminal 113.

With the above configuration, the present invention functions as a diplexer which divides input signals into two bands.

There are other circuit configurations for configuring the one polar band-pass filter. The details of the diplexer of the present invention are not affected by the circuit configuration of the band-pass filter.

In mobile telephone terminals employing two frequency bands, the diplexer of the present invention offers a simple high frequency wave dividing circuit for terminals, allowing terminals to be made smaller and lighter.

Second Exemplary Embodiment

Figure 2:
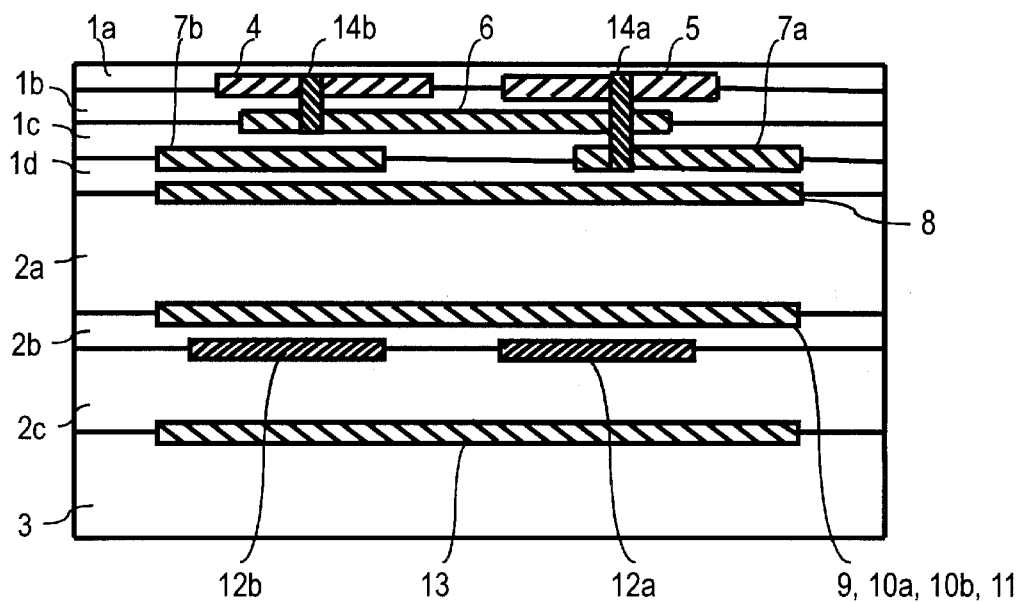
FIG. 2 shows a configuration of a diplexer in accordance with a second exemplary embodiment of the present invention.
Figure 3:
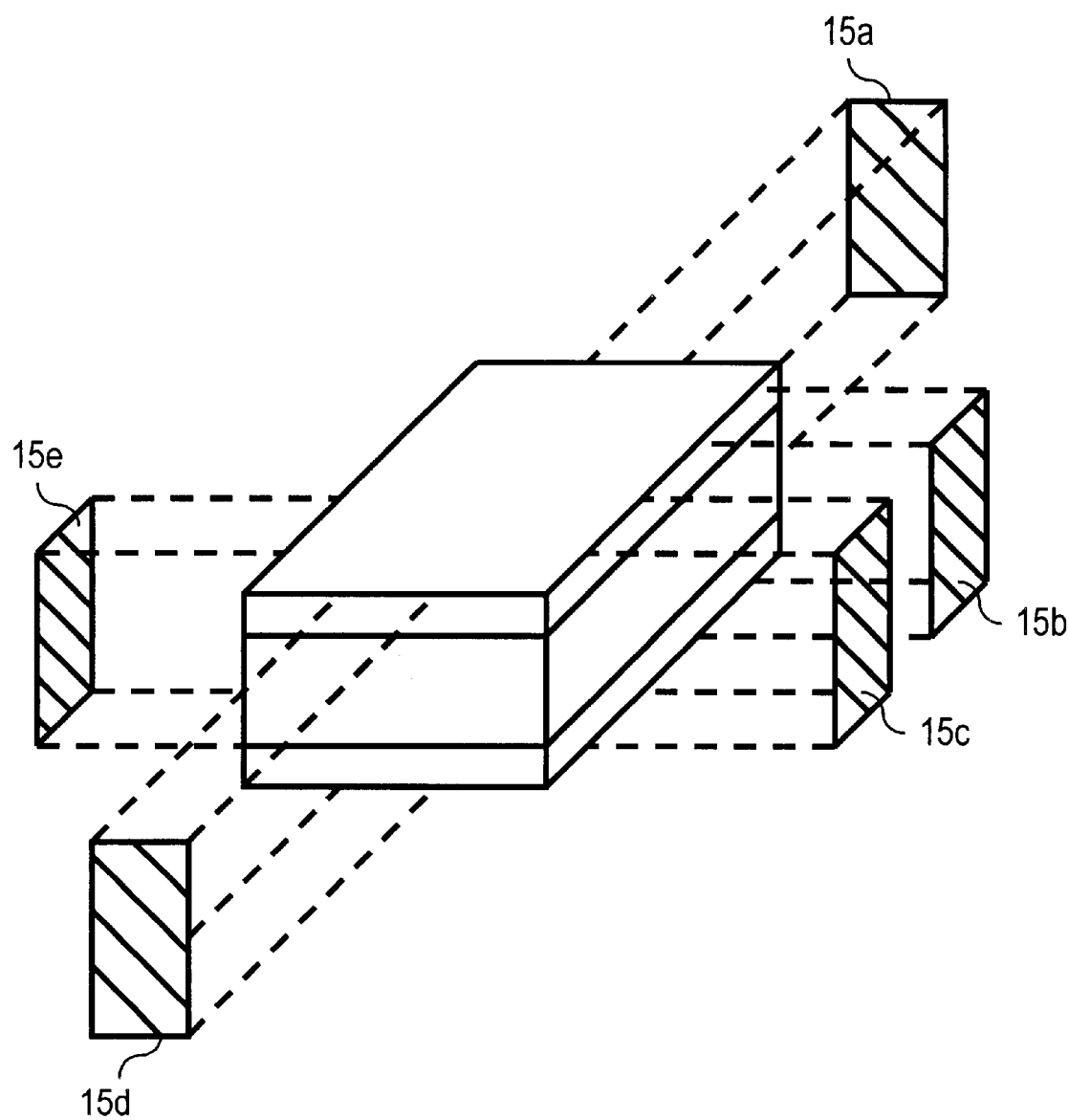
FIG. 3 is a perspective of the diplexer in accordance with the second exemplary embodiment of the present invention.

FIG. 2 shows the configuration of a diplexer in a second exemplary embodiment of the present invention. FIG. 3 is a perspective diagram of the same diplexer. In FIG. 2, a conductive layer 13 is formed as a shield electrode on a low-dielectric layer 3 mainly composed of $SiO_2—Al_2O_3—$ MO (M consists of at least one of Ba, Ca, and Sr)–$La_2O_3$—$B_2O_3$ glass, and then a high-dielectric layer 2c, composed of $Bi_2O_3$—CaO—$Nb_2O_5$ dielectric ceramic material, $Bi_2O_3$—CaO—ZnO—CuO—$Nb_2O_5$ dielectric ceramic material, or BaO—$Nd_2O_5$—$TiO_2$ dielectric ceramic material is laminated on the low-dielectric layer 3. Resonator electrodes 12a and 12b are formed on this high-dielectric layer 2c, and then a high-dielectric layer 2b composed of $Bi_2O_3$—CaO—$Nb_2O_5$ dielectric ceramic material, $Bi_2O_3$—CaO—ZnO—CuO—$Nb_2O_5$ dielectric ceramic material, or BaO—$Nd_2O_5$—$TiO_2$ dielectric ceramic material is laminated on the high-dielectric layer 2c. A capacitor electrode 11 is disposed on this high-dielectric layer 2b for forming a second matching circuit with the capacitor electrode 9 for input/output coupling and load capacitor electrodes 10a and 10b. A high-dielectric layer 2a composed of the same $Bi_2O_3$—CaO—$Nb_2O_5$ dielectric ceramic material, $Bi_2O_3$—CaO—ZnO—CuO—$Nb_2O_5$ dielectric ceramic material, or BaO—$Nd_2O_5$—$TiO_2$ dielectric ceramic material is laminated on the high-dielectric layer 2b. On top of this high-dielectric layer 2a, a conductive layer 8 is formed as a shield electrode.

Next, on the high-dielectric layer 2a where the conductive layer 8 is provided, a low-dielectric layer 1d mainly composed of $SiO_2$—$Al_2O_3$—MO—$La_2O_3$—$B_2O_3$ glass is provided. On top of this low-dielectric layer 1d, capacitor electrodes 7a and 7b are formed, and then a low-dielectric layer 1c mainly composed of $SiO_2$—$Al_2O_3$—MO—$La_2O_3$—$B_2O_3$ glass is provided. On top of this low-dielectric layer 1c, a capacitor electrode 6 is formed, and then a low-dielectric layer 1b mainly composed of $SiO_2$—$Al_2O_3$—MO—$La_2O_3$—$B_2O_3$ glass is provided. On top of this low-dielectric layer 1b, inductor electrodes 4 and 5 for forming a first matching circuit are disposed. On top of the low-dielectric layer 1b, a low-dielectric layer 1a mainly composed of the same $SiO_2$—$Al_2O_3$—MO—$La_2O_3$—$B_2O_3$ glass is provided.

The diplexer as configured above is made by sintering after printing and laminating using a ceramic green sheet.

Next, materials of the low-dielectric layers 1a to 1d and 3, and high-dielectric layers 2a to 2c which are the characteristic of the present invention are explained.

Green sheets of the low-dielectric layers 1a to 1d and 3, and high-dielectric layers 2a to 2c are manufactured respectively as follows. Glass used for the low-dielectric layers 1a to 1d and 3 is made by melting raw materials such as $SiO_2$, $H_3BO_3$, $Al(OH)_3$, $CaCO_3$, $BaCO_3$, $SrCO_3$, and $La_2O_3$ in platinum or platinum-rhodium crucible and grinding into glass powder after cooling. Then, 500 g glass powder made in the above way is added to a solution comprising 200 g methyl ethyl ketone, 25 g dibutyl phthalate, and 50 g polyvinyl butyral resin, and mixed and ground for 24 hours in a ball mill to make a slurry. A 50 $\mu$m thick green sheet of low-dielectric layer is made from the slurry using the known doctor blade method.

A $Bi_2O_3$—CaO—$Nb_2O_5$ (hereafter referred to as BCN) high-dielectric layer is made by adding 500 g BCN dielectric powder with a dielectric constant of 58, as disclosed in Japanese Laid-open Patent No. H5-225826, to a solution comprising 200 g methyl ethyl ketone, 10 g dibutyl phthalate, and 25 g polyvinyl butyral resin, and mixing for 24 hours in a ball mill to make a slurry. A 50 $\mu$m thick green sheet of BCN high-dielectric layer is made from the slurry using the doctor blade method.

A $Bi_2O_3$—CaO—ZnO—CuO—$Nb_2O_5$ (hereafter referred to as BCZCN) high-dielectric layer is made by adding 500 g BCZCN dielectric powder with a dielectric constant of 100 to a solution comprising 200 g methyl ethyl ketone, 10 g dibutyl phthalate, and 25 g polyvinyl butyral resin, and mixing in a ball mill for 24 hours to make a slurry. A 50 $\mu$m thick green sheet of BCZCN high-dielectric layer is made from the slurry using the doctor blade method.

In the same way, a BaO—$Nd_2O_5$—$TiO_2$—$Bi_2O_3$ high-dielectric layer is made by adding 20 weight % of $SiO_2$—$Al_2O_3$—MO (consisting of at least one of Ba, Ca, and Sr)–$La_2O_3$—$B_2O_3$ glass powder to 100 weight % of BaO—$Nd_2O_5$—$TiO_2$—$Bi_2O_3$ high-dielectric powder with a dielectric constant of 60, as disclosed in Japanese Laid-open Patent No. H9-108788, to make 500 g powder mixture. This powder (hereafter referred to as BNTG) is added to a solution comprising 200 g methyl ethyl ketone, 10 g dibutyl phthalate, and 25 g polyvinyl butyral resin, and mixed in a ball mill for 24 hours to make a slurry. A 50 $\mu$m thick green sheet of a BNTG high-dielectric layer is made from the slurry using the doctor blade.

The composition of BaO—$Nd_2O_5$—$TiO_2$—$Bi_2O_3$ dielectric material is explained in details in a fifth exemplary embodiment.

The high-dielectric layer sheets made in accordance with the above methods are laminated, and pressed by thermocompression at 60° C. In this process between the 600 $\mu$m thick high-dielectric layers 2a and the 50 $\mu$m thick high-dielectric layer 2b, input/output coupling capacitor 9, load capacitor electrodes 10a and 10b, and capacitor electrode 11 for the second matching circuit is formed, and between the 50 $\mu$m thick high-dielectric layer 2b and the 600 $\mu$m thick high-dielectric layers 2c, the resonator electrode 12a and 12b is formed. In the same way, the low-dielectric layer sheets are laminated and pressed by thermal compression at 60° C. to make the low-dielectric layers 1a to 1d and 3. Via holes 14a and 14b are made in the low-dielectric layer 1b to create conductivity between the conductive layers, and silver paste is filled into the via holes 14a and 14b. On green sheets of the low-dielectric layers 1b to 1d, and 3, silver paste is printed in a specified conductive pattern respectively using the screen printing method to respectively form the inductor electrode 4, inductor electrode 5 for matching circuit, capacitor electrode 6, capacitor electrodes 7a and 7b, conductive layer 8, and conductive layer 13. Then, green sheets of the low-dielectric layers 1a to 1d pressed by thermo-compression, high-dielectric layer 2a to 2c pressed by thermo-compression, and the low-dielectric layer 3 are positioned in order and laminated, pressed by thermal compression at 80° C., de-bindered at 400 to 450° C., and sintered at 900 to 950° C.

Next, silver paste is printed and sintered using the screen printing method to form the end electrodes 15a to 15e shown in FIG. 3 at the side of the sintered substance for connecting the sintered substance with a printed circuit board. Nickel and solder plated layers are then formed using barrel plating.

The operation of the diplexer as configured above is now explained.

Figure 4:
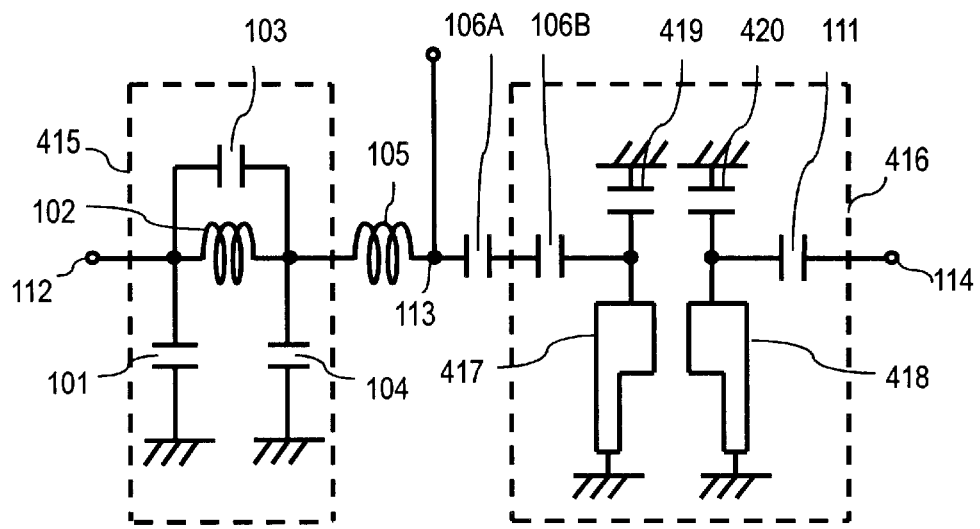
FIG. 4 is a circuit diagram of the diplexer in accordance with the second exemplary embodiment of the present invention.

The diplexer as configured above is equivalent to a circuit shown in FIG. 4. In general, it is the same as the diplexer explained in the first exemplary embodiment. Detailed explanation is therefore omitted here by allocating the same numerals to the same parts.

The conductive layer 8 and conductive layer 13 are connected to the end electrodes 15a and 15d at the side of the dielectric substance, and a shield electrode is formed by grounding the end electrodes 15a and 15d.

At the side of the dielectric substance, the end electrode 15b and inductor electrode 4 are connected to form the first inductor 102 with the first terminal 112, and the end electrode 15b is also connected to the capacitor electrode 7a. The capacitor electrode 7a forms the first capacitor 101 with the conductive layer 8, and also forms the second capacitor 103 by disposing the capacitor electrode 6 to face a part of the inductor electrode 4. The inductor electrode 4 and capacitor electrode 6 are connected through the via hole 14b. In addition, the inductor electrode 5 for matching circuit, capacitor electrode 6, and capacitor electrode 7b are connected through the via hole 14a to form the second inductor 105. The capacitor electrode 7b forms the third capacitor 104 between the conductive layer 8.

A low-pass filter 415 is configured as above, and the common terminal 113 is formed by connecting the inductor electrode 5 for matching circuit and end electrode 15e at the side of the dielectric substance.

Next, the end electrode 15e is connected to the capacitor electrode 11 for the matching circuit. The end electrode 15e forms the common terminal 113, and the capacitor electrode 11 for the matching circuit forms the fourth capacitor 106 by disposing it to face a part of the resonator electrode 12b. The end electrode 15c is connected to the input/output coupling capacitor electrode 9 to form the second terminal 114. The input/output coupling capacitor electrode 9 forms the sixth capacitor 111 by disposing it to face a part of the resonator electrode 12a. One end of the resonator electrode 12b is connected to the grounded end electrode 15a to form a first quarter wavelength resonator 417. In the same way, one end of the resonator electrode 12a is connected to the grounded end electrode 15a to form a second quarter wavelength resonator 418. The load capacitor electrode 10b is disposed to face a part of the resonator electrode 12b, and one end of the load capacitor electrode 10b is connected to the grounded end electrode 15c to form a first load capacitor 419. The load capacitor electrode 10a is disposed to face a part of the resonator electrode 12a, and one end of the load capacitor electrode 10a is connected to the grounded end electrode 15c to form a second load capacitor 420. Accordingly, a band-pass filter 416 is configured.

The band-pass filter 416 made in the high-dielectric layers 2a to 2c forms an attenuation pole by electromagnetic connection between the first quarter wavelength resonator 417 and second quarter wavelength resonator 418. It is set to form a passband in the second band and the attenuation pole in the first band. In the second band, the low-pass filter 415, as in the first exemplary embodiment, functions as an inductor connected between the common terminal 113 and ground. Here, a phase shifter of π-type high-pass filter type is configured by adjusting the resonator length of the first quarter wavelength resonator 417 and capacitance of the first load capacitor 419. By employing the configuration to laminate two types of dielectric layers into one piece, the diplexer can be made smaller and shorter.

With the above configuration, the second exemplary embodiment operates as a diplexer which divides input signals to two bands.

Figure 5:
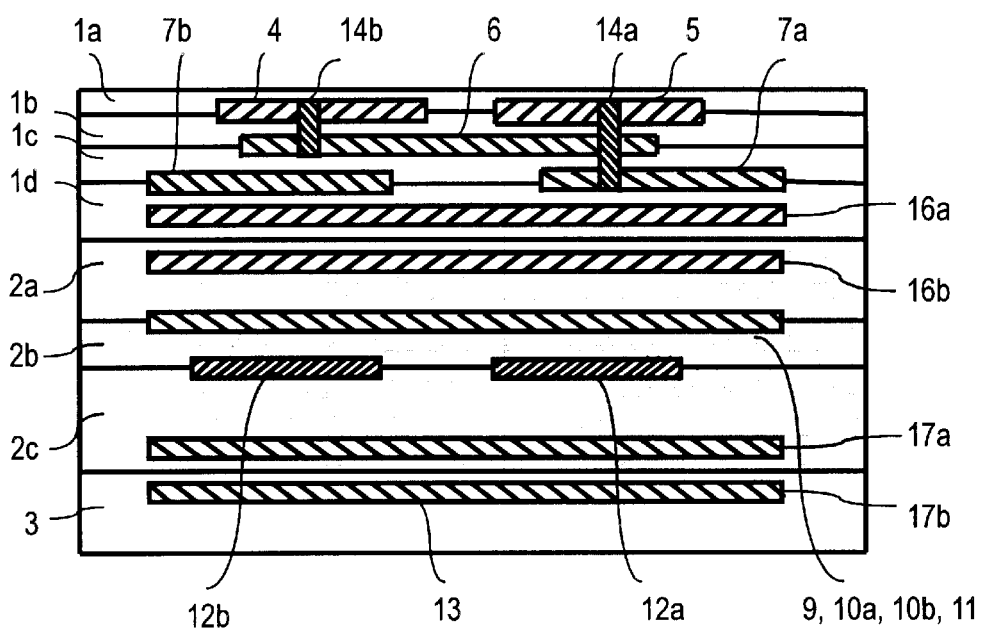
FIG. 5 shows another configuration of the diplexer in accordance with the second exemplary embodiment of the present invention.

In this exemplary embodiment, a shield electrode is disposed between the low-dielectric layer and high-dielectric layer. As shown in FIG. 5, it is also possible to form conductive layers 16a, 16b, 17a and 17b respectively as shield electrodes inside the low-dielectric layer and high-dielectric layer. This will further suppress dispersion in the characteristics of the band-pass filters and reduce manufacturing costs because diffusion of high-dielectric ceramic material to low-dielectric ceramic material during sintering can be reduced, which further facilitates sintering of the dielectric substance.

Figure 6:
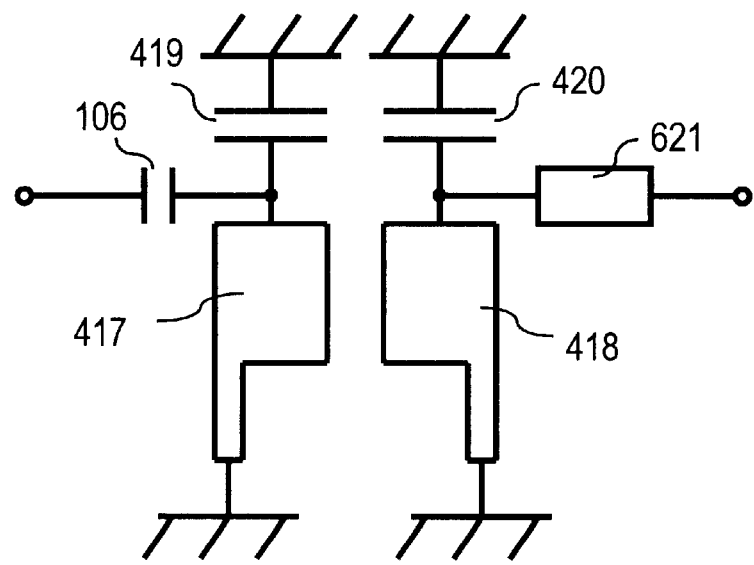
FIG. 6 is a circuit diagram showing another configuration of a resonator electrode in the diplexer in accordance with the second exemplary embodiment of the present invention.

In this exemplary embodiment, capacitive coupling is employed as input/output coupling for the band-pass filter. As shown in FIG. 6, a tapping electrode 621 can also be employed for connection. This has the advantage of easier impedance matching of the band-pass filter with a broader band and lower insertion loss.

Furthermore, in mobile telephone terminals for two channels, the diplexer of the present invention offers a simpler high frequency wave dividing circuit for terminals, allowing terminals to be made smaller and lighter.

Third Exemplary Embodiment

Figure 7:
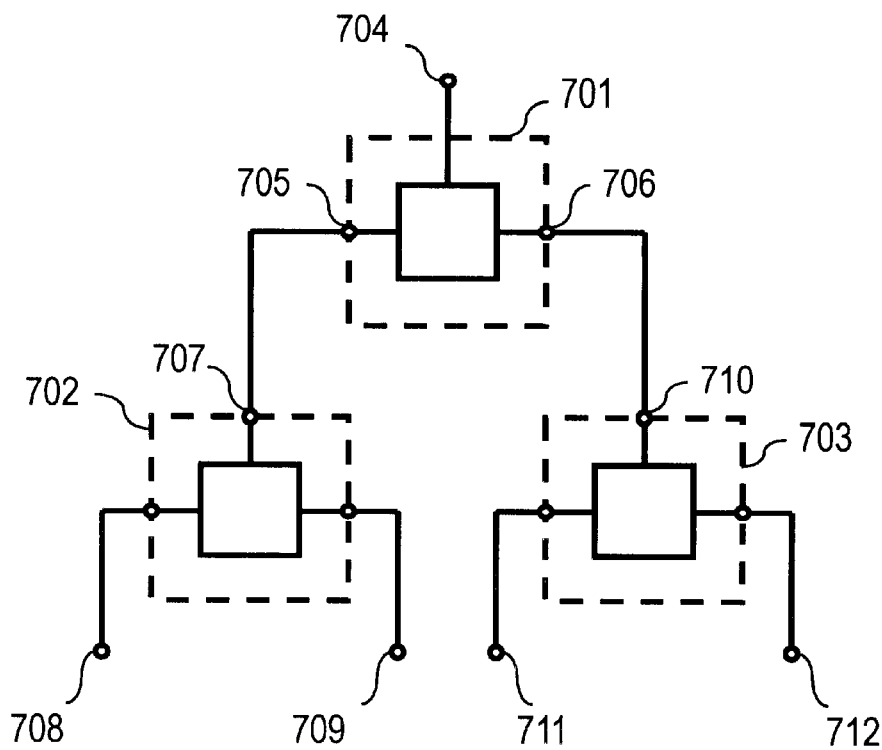
FIG. 7 is a circuit diagram of a duplexer in accordance with a third exemplary embodiment of the present invention.

FIG. 7 shows a configuration of a duplexer in a third exemplary embodiment of the present invention. In FIG. 7, a common terminal of a first diplexer 702 is connected to one output terminal of a single polar double transmission switch (hereafter referred to as SPDT switch 701, and a common terminal of a second diplexer 703 is connected to the other output terminal of the SPDT switch 701. In this way, the duplexer is configured with an input terminal of the SPDT switch 701 as an antenna terminal 704, a first terminal of the first diplexer 702 as a first transmission terminal 708, a second terminal of the first diplexer 702 as a second transmission terminal 709, a first terminal of a second diplexer 703 as a first receiving terminal 711, and a second terminal of the second diplexer 703 as a second receiving terminal 712.

The operation of the duplexer as configured above is now explained.

The diplexer employed in this exemplary embodiment is the same as that explained in the first and second exemplary embodiments. Detailed explanation of its operation is thus omitted.

In mobile telephone terminals adopting the TDMA system, transmission and receiving does not take place simultaneously. Therefore, the SPDT switch 701 which switches the channel timewise can be employed.

The first diplexer 702 prevents transmission signals in the first band input to the first transmission terminal 708 from flowing to the second transmission terminal 709, and outputs them to the common terminal 707 of the first diplexer. These transmission signals in the first band then flow to the first output terminal 705 of the SPDT switch 701. The SPDT switch 701 prevents signals in the first band from flowing to the second output terminal 706, and outputs them from the antenna terminal 704. In the same way, the first diplexer 702 prevents transmission signals in the second band input to the second transmission terminal 709 from flowing to the first transmission terminal 708, and outputs them to the common terminal 707 of the first diplexer 702. These transmission signals in the second band then flow to the first output terminal 705 of the SPDT switch 701. The SPDT switch 701 prevents signals in the second band from flowing to the second output terminal 706, and outputs them from the antenna terminal 704.

Next, the SPDT switch 701 prevents receiving signals in the first band input to the antenna terminal 704 from flowing to the first output terminal 705 and outputs them to the second output terminal 706. These receiving signals in the first band then flow to the common terminal 710 of the second diplexer 703. The second diplexer 703 prevents these signals in the first band from flowing to the second receiving terminal 712, and outputs them to the first receiving terminal 711. In the same way, the SPDT switch 701 prevents receiving signals in the second band input to the antenna terminal 704 from flowing to the first output terminal 705, and outputs them to the second output terminal 706. These receiving signals in the second band then flow to the common terminal 710 of the second diplexer 703. The second diplexer 703 prevents these signals in the second band from flowing to the first receiving terminal 711, and outputs them to the second receiving terminal 712.

With the above configuration, the third exemplary embodiment functions as a duplexer corresponding to the TDMA system for using the two frequency bands.

The present invention thus can be employed as a duplexer for two systems, for example, Personal Digital Cellular (PDC) and Personal Handy Phone System (PHS) by using PDC in the first band and PHS in the second band.

The present invention can also be employed as a duplexer for two systems, for example, the European standard Group Special Mobile (GSM), and the European Personal Communications Network (PCN), by using GSM in the first band and PCN in the second band.

There is a wide variety of types of SPDT switches, but the duplexer used in the present invention is not affected by the type of SPDT switch. For mobile telephone terminals employing two frequency bands, the use of the duplexer of the present invention enables the common circuit of the terminals to be simply configured, allowing the terminal to be made smaller and lighter.

Fourth Exemplary Embodiment

Figure 8:
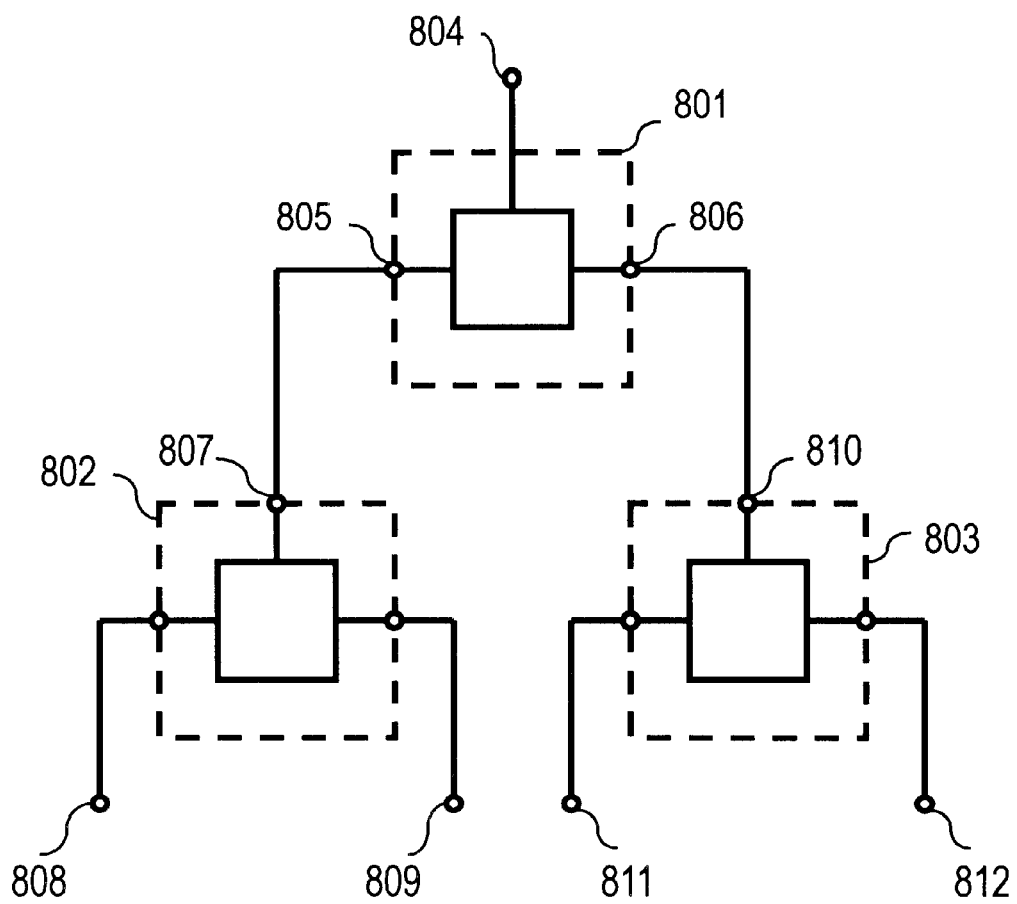
FIG. 8 is a circuit diagram of a duplexer in accordance with a fourth exemplary embodiment of the present invention.
Figure 9:
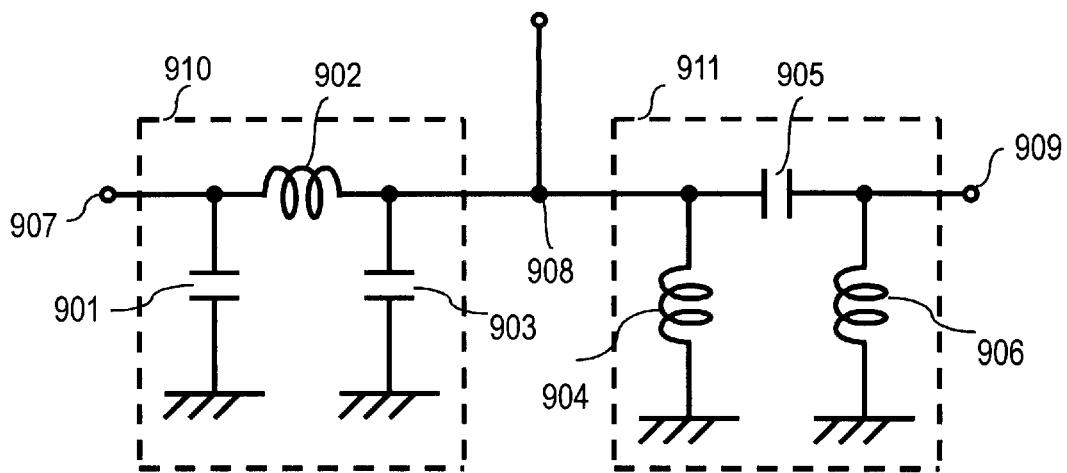
FIG. 9 is a circuit diagram of a diplexer in accordance with the prior art.
Figure 10:
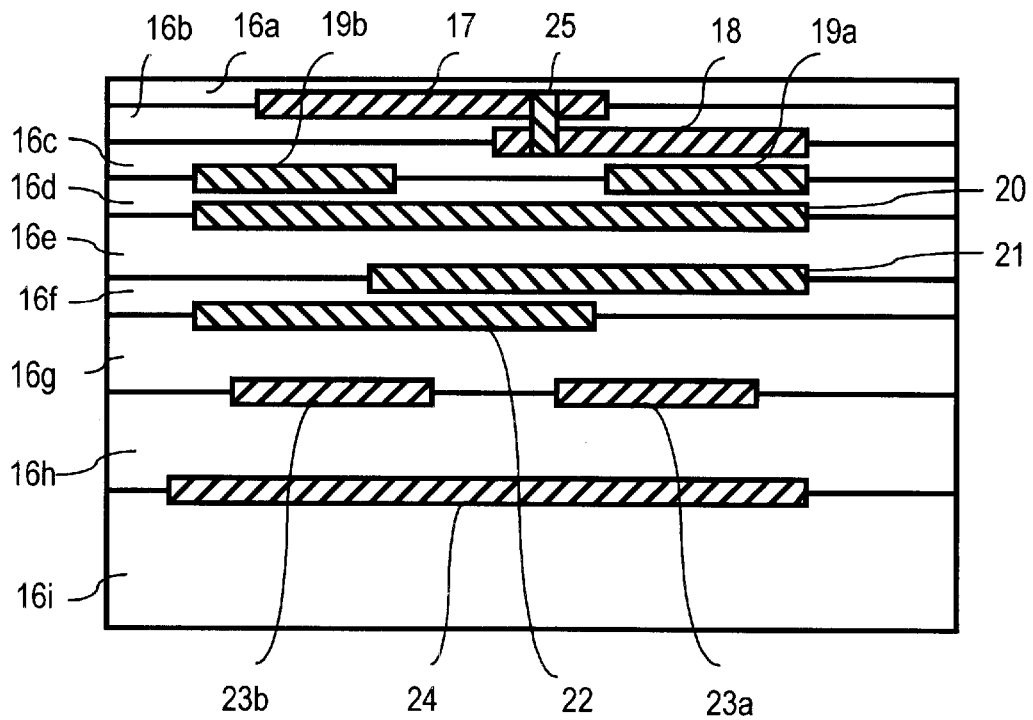
FIG. 10 shows a configuration of the diplexer in accordance with the prior art.
Figure 11:
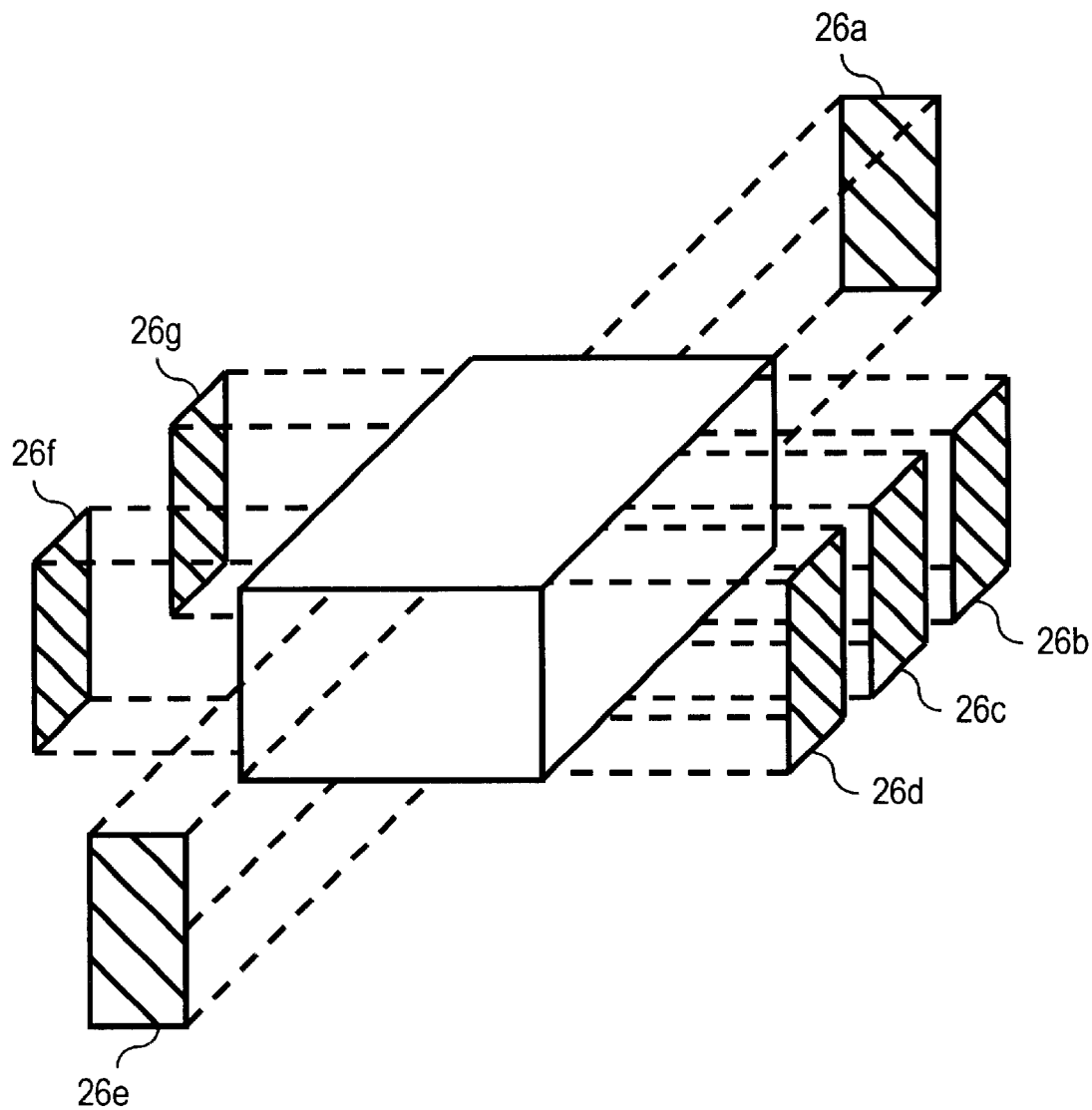
FIG. 11 is a perspective of the diplexer in accordance with the prior art.

FIG. 8 shows the configuration of a duplexer in a fourth exemplary embodiment of the present invention. In FIG. 8, an antenna terminal 807 of a first duplexer 802 is connected to a first terminal 805 of a diplexer 801, and an antenna terminal 810 of a second duplexer 803 is connected to a second terminal 806. In this way, a duplexer is configured with a common terminal of the diplexer 801 as an antenna terminal 804, a transmission terminal of the first duplexer 802 as a first transmission terminal 808, a receiving terminal of the first duplexer 802 as a first receiving terminal 809, a transmission terminal of the second duplexer 803 as a second transmission terminal 811, and a receiving terminal of the second duplexer 803 as a second receiving terminal 812.

The operation of the duplexer as configured above is now explained.

The diplexer employed in this exemplary embodiment is the same as that explained in the first and second exemplary embodiments. Detailed explanation of its operation is thus omitted.

Transmission and receiving are executed at the same time in mobile telephone terminals adopting systems other than the TDMA system. Therefore, the SPDT switch, which switches the channels timewise, cannot be employed. Accordingly, signals in the first band and second band are first divided by the diplexer, and then separated to transmission and receiving signals in each band.

The first duplexer 802 prevents transmission signals in the first band input to the first transmission terminal 808 from flowing to the first receiving terminal 809. Instead, they are output to the antenna terminal 807 of the first duplexer, and then to the first terminal 805 of the diplexer 801. The diplexer 801 prevents these signals in the first band from flowing to the second terminal 806, and outputs them from the antenna terminal 804. The diplexer 801 prevents receiving signals in the first band input to the antenna terminal 804 from flowing to the second terminal 806. Instead, they are output to the first terminal 805, and then to the antenna terminal 807 of the first duplexer 802. The first duplexer 802 prevents signals in the first band from flowing to the first transmission terminal 808, and outputs to the first receiving terminal 809.

Then, transmission signals in the second band input to the second transmission terminal 811 are prevented from flowing to the second receiving terminal 812 by the second duplexer 803. Instead, they are output to the antenna terminal 810 of the second duplexer, and then to the second terminal 806 of the diplexer 801. The diplexer 801 prevents these signals from flowing to the first terminal 805, and outputs them from the antenna terminal 804. The diplexer 801 prevents receiving signals in the second band input to the antenna terminal 804 from flowing to the first terminal 805. Instead, they are output to the second terminal 806 and then to the antenna terminal 810 of the second duplexer 803. The second duplexer 803 prevents these signals from flowing to the second transmission terminal 811, and outputs to the receiving terminal 812.

With the above configuration, this exemplary embodiment functions as a duplexer for systems other than the TDMA system for using the two frequency bands.

The duplexer of the present invention thus can be employed for two systems, for example, Advanced Mobile Phone Service (AMPS), which is an analog mobile phone in the US, and Personal Communications Systems (PCS), which is a personal mobile communications system in the US, by using AMPS in the first band and PCS in the second band.

Furthermore, for mobile telephone terminals employing two frequency bands, the use of the duplexer of the present invention enables the common circuit of the terminals to be simply configured, allowing the terminal to be made smaller and lighter.

Fifth Exemplary Embodiment

The composition of $BaO$—$Nd_2O_5$—$TiO_2$—$Bi_2O_3$ dielectric material used in a high-dielectric layer of the aforementioned diplexer of the present invention is explained next. This material is made by mixing the first powder component and second powder component at a specified ratio. The following explanation uses these expressions.

First, the composition of the first powder component is explained. As source materials, chemically high purity (99 weight % or above) of $BaCO_3$, $Nd_2O_3$, $TiO_2$, and $Bi_2O_3$ are used. After adjusting the purity of the source substance, each source substance is weighed to achieve a specified values of x, y, z, and w when defined as $xBaO$—$yNd_2O_3$—$zTiO_2$—$wBi_2O_3$ (x+y+z+w=1). These powders are mixed in a ball mill with zirconia stones and pure water for 17 hours to make a slurry. After mixing, the slurry is dried and kept in an alumina crucible for provisional sintering for 2 hours at 1000 to 1300° C. Provisionally sintered slurry is crushed and ground in the ball mill for 17 hours, and dried to complete the first powder component.

The composition of the second powder component is explained next. Source materials are chemically high purity (99 weight % or above) substances such as $SiO_2$, $H_3BO_3$, $Al_2(OH)_3$, $CaCO_3$, $BaCO_3$, $SrCO_3$, and $La_2O_3$. After correcting purity of the source substances, they are weighed in accordance with the composition shown in Table 1. Powder of these substances are mixed and kept in a platinum or platinum-rhodium crucible to melt at 1400 to 1500° C. and cooled rapidly. After crushing, the same method as mixing is used for grinding, and dried to make the second powder component. The composition and characteristics of the mixed second component are shown in Table 1.

TABLE 1

| Specimen No. | Composition of the second component (weight %) | | | | | | | | | |
|---|---|---|---|---|---|---|---|---|---|---|
| | $SiO_2$ | $La_2O_3$ | BaO | CaO | SrO | $B_2O_3$ | $Al_2O_3$ | $ZrO_2$ | $LiO_2$ | $K_2O$ |
| A | 45 | 10 | 20 | 15 | | 5 | 5 | | | |
| B | 40 | 15 | 25 | 10 | | 5 | | 5 | | |
| C | 45 | 10 | 20 | 15 | 5 | | | | 5 | |
| D | 45 | 10 | 25 | | 5 | 5 | 5 | | | 5 |
| E | 45 | 10 | | 20 | 15 | 5 | | 5 | | |

The first and second powder components are weighed in the ratio shown in Table 2, wet blended in the ball mill, and then dried. Average particle diameter of this mixed powder is measured using the laser diffraction measuring method. After adding 8 weight % of a 5 weight % polyvinyl alcohol solution as a binder and mixing them, mixed powder is granulated using a 32-mesh sifter, and pressed with a disc of 13 mm diameter and about 5 mm thickness under 100 Mpa. Pressed powder is heated at 60020 C. for 3 hours to burn out the binder, kept in a magnesia porcelain container, covered with a lid, and sintered at temperatures ranging between 800 and 1100° C. for 2 hours. The dielectric characteristics of the sintered body sintered at the temperature which makes the maximum density were measured using microwaves. Resonance frequency and Q value were calculated in accordance with the dielectric resonance method. Relative dielectric constant ($\in r$) is calculated from the dimensions and resonance frequency of the sintered substance. Resonance frequency was between 2 and 7 GHz.

Resonance frequency at −25° C., 20° C., and 85° C. was then measured to calculate its temperature coefficient (τf) using the method of least square. The deflective strength of the sintered substance was also measured using the method in accordance with JIS R1601. Results are shown in Table 2. The Qf product in Table 2 is the Q value multiplied by the frequency f at which Q value is measured. The frequency f is between 2 and 7 GHz depending on the size and shape of the specimen. The Qf product is thus calculated to obtain a value independent of the size or shape of the specimen. This is the method generally used in the industry.

As shown in Table 2, Specimens Nos. 2 to 15, which have a porcelain composition applicable to this exemplary embodiment were sintered at between 925° C. and 105° C., showing excellent microwave dielectric characteristics: Relative dielectric constant ($\in r$) between 41 and 88, Qf product between 1200 and 3300 GHz, and temperature coefficient (τf) of resonance frequency between 15 and 45 ppm/° C. The deflective strength of these porcelains were all above 180 Mpa, which is larger than the deflective strength of a conventional $Bi_2O_3$—CaO—$Nb_2O_5$ material with 140 Mpa.

The composition of the second component glass showed good dielectric characteristics in the range of compositions between Specimen No. 5 and 8. This demonstrates that any glass containing $SiO_2$, MO (M contains at least one of Ba, Ca, and Sr), and $La_2O_3$ can be used as the second component.

TABLE 2

| Specimen | Composition of the first component (mol %) | | | | Mixing ratio of the second component | | Ts | Characteristics | | | |
|---|---|---|---|---|---|---|---|---|---|---|---|
| No. | x | y | z | w | Type | Wt % | (C.°) | ∈r | Qf | τf | σs |
| 1# | 15 | 15 | 67 | 3 | A | 1 | nst | | | | |
| 2 | 15 | 15 | 67 | 3 | A | 3 | 1050 | 88 | 3300 | +10 | 240 |
| 3 | 15 | 15 | 67 | 3 | A | 5 | 1025 | 82 | 3300 | +3 | 210 |
| 4 | 15 | 15 | 67 | 3 | A | 10 | 975 | 72 | 3000 | +1 | 200 |
| 5 | 15 | 15 | 67 | 3 | B | 10 | 975 | 69 | 1800 | +8 | 210 |
| 6 | 15 | 15 | 67 | 3 | C | 10 | 1000 | 71 | 3100 | −5 | 200 |
| 7 | 15 | 15 | 67 | 3 | D | 10 | 975 | 71 | 2200 | −2 | 190 |
| 8 | 15 | 15 | 67 | 3 | B | 10 | 1000 | 70 | 2800 | +4 | 200 |
| 9 | 15 | 15 | 67 | 3 | A | 20 | 950 | 60 | 2800 | −4 | 200 |
| 10 | 18 | 18 | 61 | 3 | A | 20 | 975 | 51 | 1300 | +10 | 190 |
| 11 | 11 | 11 | 75 | 3 | A | 20 | 950 | 64 | 2400 | +45 | 210 |
| 12 | 11 | 18 | 68 | 3 | A | 20 | 950 | 55 | 2200 | −8 | 210 |
| 13 | 18 | 11 | 68 | 3 | A | 20 | 950 | 62 | 1600 | +1 | 190 |
| 14 | 14 | 14 | 67 | 3 | A | 20 | 925 | 57 | 2400 | −10 | 180 |
| 15 | 15 | 15 | 67 | 3 | A | 50 | 925 | 41 | 1200 | −15 | 180 |
| 16# | 15 | 15 | 67 | 3 | A | 60 | 900 | 36 | 750 | −25 | nmd |
| 17# | 15.5 | 15.5 | 69 | 0 | A | 10 | 1025 | 74 | 2900 | +78 | nmd |
| 18# | 14.5 | 14.5 | 63.5 | 7.5 | A | 10 | mel | — | — | — | nmd |
| 19# | 8 | 22 | 67 | 3 | A | 10 | 1000 | 38 | 3200 | −5 | nmd |
| 20# | 22 | 8 | 67 | 3 | A | 10 | 1000 | 53 | 1800 | +155 | nmd |
| 21# | 26 | 26 | 45 | 3 | A | 10 | 1025 | 72 | 1600 | +252 | nmd |
| 22# | 8 | 8 | 81 | 3 | A | 10 | 1000 | 51 | 2500 | +272 | nmd | x, y, z, w: xBaO—y$Nd_2O_3$—z$TiO_2$—w$Bi_2O_3$
Ts: Sintered temperature,

TABLE 2-continued

| Specimen | Composition of the first component (mol %) | | | | Mixing ratio of the second component | | Ts | Characteristics | | | |
|---|---|---|---|---|---|---|---|---|---|---|---|
| No. | x | y | z | w | Type | Wt % | (C.°) | εr | Qf | τf | σs |

εr: Relative dielectric constant,
Qf: Qf Product,
τf: Temperature coefficient,
σs: Deflective strength
nst: Not sintered,
mel: Melted,
nmd: Not measured
Specimen Nos. marked with # are out of the scope of the present invention. Average particle diameter before sintering the mixed powder is 0.9 μm.

In Specimen No. 1, when the mixing ratio of the second component than 3 weight %, it did not sinter at 1100° C. or below, thus not satisfying the purpose of the present invention. In Specimen No. 16, when the mixing ratio of the second component exceeds 50 weight %, dielectric constant fell to 40 or below and the Qf product became a small 1000 GHz, which was also not suitable for the present invention.

When x, y, z, and w in $xBaO$—$yNd_2O_3$—$zTiO_2$—$wBi_2O_3$ (x+y+z+w =1) of the first component was out of the range of the present invention, which are specimens Nos. 17 to 22, relative dielectric constant became smaller than 40, and temperature coefficient of resonance frequency changed to a large positive value exceeding +50 ppm/° C., which are not suitable for the present invention because they do not sinter as porcelain.

Sixth Exemplary Embodiment

Another exemplary embodiments of the second component are explained next. Characteristics were evaluated using the same method as in the fifth exemplary embodiment. Compositions shown in Table 3 were used for the second component. Results are shown in Table 4.

As shown in Table 4, specimens Nos. 23 to 28, which are dielectric porcelains within the scope of this exemplary embodiment, were sintered at a temperature between 925° C. and 975° C. It was confirmed that these specimens show good microwave dielectric characteristics, with a relative dielectric constant between 57 and 70, Qf product between 1900 and 3200 GHz, and temperature coefficient of resonance frequency between −10 and +3 ppm/° C.; and deflective strength of 180 MPa or above.

TABLE 3

| Specimen | Composition of the second component (Weight %) | | | | | | |
|---|---|---|---|---|---|---|---|
| No. | $SiO_2$ | $La_2O_3$ | BaO | CaO | SrO | $B_2O_3$ | $Al_2O_3$ |
| F | 47 | 15 | 5 | 18 | 10 | 2 | 3 |
| G | 42 | 10 |  | 20 | 10 | 5 | 13 |
| H | 45 | 10 | 22 |  | 10 | 8 | 5 |
| I* | 35 | 10 | 25 | 20 |  | 5 | 5 |
| J* | 55 | 10 | 15 | 10 |  | 5 | 5 |
| K* | 45 | 10 | 20 |  |  | 5 | 20 |
| L* | 45 | 10 | 20 | 5 |  | 15 | 5 |
| M* | 45 | 20 | 25 |  |  | 5 | 5 |
| N* | 45 | 2 | 23 | 15 |  | 10 | 5 |

TABLE 4

| Specimen | Composition of the first component (mol %) | | | | Mixing ratio of the second component | | Ts | Characteristics | | | |
|---|---|---|---|---|---|---|---|---|---|---|---|
| No. | x | y | z | w | Type | Wt % | (C.°) | εr | Qf | τf | σs |
| 23 | 15 | 15 | 67 | 3 | F | 10 | 950 | 70 | 2400 | −8 | 190 |
| 24 | 15 | 15 | 67 | 3 | F | 20 | 925 | 59 | 2200 | −3 | 180 |
| 25 | 15 | 15 | 67 | 3 | G | 10 | 975 | 70 | 3200 | −3 | 220 |
| 26 | 15 | 15 | 67 | 3 | G | 20 | 975 | 60 | 3100 | +3 | 200 |
| 27 | 15 | 15 | 67 | 3 | H | 10 | 975 | 68 | 2200 | −10 | 200 |
| 28 | 15 | 15 | 67 | 3 | H | 20 | 950 | 57 | 1900 | −8 | 200 |
| 29* | 15 | 15 | 67 | 3 | I | 20 | 950 | 63 | 800 | −3 | nmd |
| 30* | 15 | 15 | 67 | 3 | J | 20 | 1050 | 58 | 2500 | +5 | nmd |
| 31* | 15 | 15 | 67 | 3 | K | 20 | 1075 | 56 | 2200 | +3 | nmd |
| 32* | 15 | 15 | 67 | 3 | L | 20 | 975 | 61 | 1500 | −3 | nmd |
| 33* | 15 | 15 | 67 | 3 | M | 20 | 925 | 55 | 800 | −18 | nmd |
| 34* | 15 | 15 | 67 | 3 | N | 20 | 1050 | 62 | 2600 | +1 | nmd | x, y, z, w: $xBaO$—$yNd_2O_3$—$zTiO_2$—$wBi_2O_3$
Ts: Sintered temperature,
εr: Relative dielectric constant,
Qf: Qf Product,
τf: Temperature coefficient,
σs: Deflective strength TABLE 4-continued

| Specimen | Composition of the first component (mol %) | | | | Mixing ratio of the second component | | Ts | Characteristics | | | |
|---|---|---|---|---|---|---|---|---|---|---|---|
| No. | X | y | z | w | Type | Wt % | (C.°) | εr | Qf | τf | σs | nst: Not sintered,
mel: Melted,
nmd: Not measured
Average particle diameter before sintering the mixed powder is 0.9 μm.

Specimen No. 29, using the second component type I with 40 weight % or less $SiO_2$, and Specimen No. 33, using the second component type M with 15 weight % or above $La_2O_3$, are not suitable because the Qf product fell below 1000 GHz. Specimen No. 30, using the second component type J with 50 weight % or more $SiO_2$, Specimen No. 31, using the second component type K with 15 weight % or more $Al_2O_3$, and Specimen No. 34, using the second component type N with 5 weight % or less $L_2O_3$ demonstrated a high sintering temperature above 1050° C., which is not suitable. Specimen No. 32, using the second component L with 10 weight % or more $B_2O_3$ did not show any problem with sintering temperature and electrical characteristics, but it is unsuitable because it showed extreme difficulty in making a green sheet. When a slurry was made by mixing an appropriate amount of binder, plasticizer, and solvent, and then a green sheet was made using methods such as the doctor blade method, gellation of the slurry occurred.

Seventh Exemplary Embodiment

Next, the effect was examined of further adding copper oxide. Chemically high purity (99 weight % or above) CuO powder was weighed and mixed with both first and second components, and specimens were prepared and their characteristics were measured in accordance with the same method as the fifth exemplary embodiment. The composition A in Table 1 was employed for the second component. Results are shown in Table 5.

It is difficult to make a green sheet with Specimen No. 32.

As shown in FIG. 5, dielectric porcelain with copper oxide showed 50° C. to 75° C. lower sintering temperature compared to dielectric porcelain without adding copper oxide. There was no change in electrical characteristics. Accordingly, with addition of copper oxide, sintering temperature can be always kept below 950° C., so a multi-layer resonance device can be made with an internal conductor made of silver, which has high conductivity and a melting point of 961° C. In case of Specimen No. 38, however, if the amount of CuO added exceeds 5 weight %, which is out of the scope of the present invention, the Qf product fell to 1000 GHz or below, making it not suitable.

Eighth Exemplary Embodiment

Next, the effect was examined of an average particle diameter of mixed powder. The average particle diameter of mixed powder is adjustable by changing the mixing duration and diameter of zirconia stone. Results are shown in Table 6.

TABLE 5

| Specimen | Composition of the first component (mol %) | | | | Mixing ratio of the second component | | CuO weight | Ts | Characteristics | | | |
|---|---|---|---|---|---|---|---|---|---|---|---|---|
| No. | x | y | z | w | Type | Wt % | % | (C.°) | εr | Qf | τf | σs |
| 4 | 15 | 15 | 67 | 3 | A | 10 | 0 | 975 | 72 | 3000 | +1 | 200 |
| 35 | 15 | 15 | 67 | 3 | A | 10 | 0.5 | 925 | 71 | 2900 | +3 | 200 |
| 36 | 15 | 15 | 67 | 3 | A | 10 | 1.5 | 925 | 69 | 2400 | −3 | 200 |
| 37 | 15 | 15 | 67 | 3 | A | 10 | 5 | 900 | 67 | 1300 | −4 | 180 |
| 38+ | 15 | 15 | 67 | 3 | A | 10 | 7.5 | 900 | 67 | 700 | −7 | 180 | x, y, z, w: $xBaO$—$yNd_2O_3$—$zTiO_2$—$wBi_2O_3$
Ts: Sintered temperature,
εr: Relative dielectric constant,
Qf: Qf Product,
τf: Temperature coefficient,
σs: Deflective strength
Average particle diameter before sintering the mixed powder is 0.9 μm.
It is difficult to make a green sheet with Specimen No. 32.

TABLE 6

| Specimen No. | Composition of the first component (mol %) | | | | Mixing ratio of the second component | | CuO (wt %) | Particle diameter | Ts (C.°) | Characteristics | | | |
|---|---|---|---|---|---|---|---|---|---|---|---|---|---|
| | x | y | z | w | Type | Wt % | | | | εr | Qf | τf | σs |
| 4 | 15 | 15 | 67 | 3 | A | 10 | 0 | 0.9 | 975 | 72 | 3000 | +1 | 200 |
| 39 | 15 | 15 | 67 | 3 | A | 10 | 0 | 0.75 | 925 | 72 | 2700 | +4 | 220 |
| 40 | 15 | 15 | 67 | 3 | A | 10 | 0 | 0.6 | 925 | 72 | 2900 | +3 | 230 |
| 36 | 15 | 15 | 67 | 3 | A | 10 | 1.5 | 0.9 | 925 | 69 | 2400 | −3 | 200 |
| 41 | 15 | 15 | 67 | 3 | A | 10 | 1.5 | 0.75 | 900 | 69 | 2500 | −4 | 220 |
| 42 | 15 | 15 | 67 | 3 | A | 10 | 1.5 | 0.6 | 875 | 70 | 2600 | −6 | 220 |

When the particle diameter of mixed powder was made as fine as 0.6 μm, sintering temperature further lowered by 25 to 50° C., and deflective strength also increased by about 10%. There was no change in electrical characteristics. Accordingly, by making particle diameter of mixed powder 0.6 μm or below, a multi-layer resonance device having internal conductor made of silver, which has high electric conductivity and a melting point of 961° C., can be made.

Inorganic compounds other than those in the above exemplary embodiment can be used as long as their contents are within the scope of the present invention and there is no detrimental effect on characteristics.

Ninth Exemplary Embodiment

Next, a range of compositions of glasses employed for the low-dielectric layer of the diplexer of the present invention are explained. The bonding strength between the low-dielectric layer and high-dielectric layer, and sintering state such as delamination and waviness of a substrate are evaluated from the appearance of a substrate made by sintering of such glasses and materials for the high-dielectric layer. Interfacial bonding strength was evaluated using a tensile test. Cracking of cut section when the substrate was cut using a dicer with 0.2 mm thick blade at 1.0 mm/sec was also observed. The thermal expansion coefficient of the glasses was measured using the TMA method, and the softening point was measured by DTA (Differential Thermal Analysis) method.

Specimen Nos. 1 to 6 are low-dielectric materials with fixed amounts of $SiO_2$—$Al_2O_3$—BaO—CaO—$B_2O_3$ amorphous glass mixed with a variable amount of ceramic powder of forsterite, zirconia, and alumina, and each high-dielectric material of BCN, BCZCN, and BNTG sintered in accordance with the first exemplary embodiment. Their evaluation results are shown in Table 7. Weight mixing ratio of amorphous glass and ceramic powder of low-dielectric layer and ceramic powder is 50:50.

Low-dielectric material of specimen Nos. 1 to 5 showed slightly weaker bonding strength at an interface with BCN and BNTG but sintering was possible. Integral sintering was not applicable to BCZCN, and the sintered body was damaged. The thermal expansion coefficient of BCN is $93 \times 10^{-7}/°$ C., BNTG is $95 \times 10^{-7}/°$ C., but BCZN was a low $76 \times 10^{-7}/°$ C. Accordingly, the low-dielectric material of specimen Nos. 1 to 5 which have thermal expansion coefficients of 88 to $93 \times 10^{31}$ $^7/°$ C., relatively close to BCN and BNTG, were possible to sinter with BCN and BNTG, but the sintered substance was damaged in the case of BCZN because a large compression stress was assumed to have been applied to the high-dielectric layer.

TABLE 7

| Specimen No. | | 1 | 2 | 3 | 4 | 5 | 6 | 7 | 8 |
|---|---|---|---|---|---|---|---|---|---|
| Ceramic powder | Forsterite ($Mg_2SiO_4$) | 100 | 75 | 75 | 50 | 50 | 50 | 50 | 25 |
| | Zirconia ($ZrO_2$) | 0 | 25 | 0 | 50 | 20 | 5 | 0 | 0 |
| | Alumina ($Al_2O_3$) | 0 | 0 | 25 | 0 | 30 | 45 | 50 | 75 |
| Amorphous glass | $SiO_2$ | 50 | 50 | 50 | 50 | 50 | 50 | 50 | 50 |
| | $B_2O_3$ | 5 | 5 | 5 | 5 | 5 | 5 | 5 | 5 |
| | $Al_2O_3$ | 5 | 5 | 5 | 5 | 5 | 5 | 5 | 5 |
| | BaO | 20 | 20 | 20 | 20 | 20 | 20 | 20 | 20 |
| | CaO | 20 | 20 | 20 | 20 | 20 | 20 | 20 | 20 |
| | SrO | 0 | 0 | 0 | 0 | 0 | 0 | 0 | 0 |
| | $La_2O_3$ | 0 | 0 | 0 | 0 | 0 | 0 | 0 | 0 |
| | Softening point (__C) | | | | | | | | |
| Weight ratio of ceramic powder: amorphous glass | | 50:50 | 50:50 | 50:50 | 50:50 | 50:50 | 50:50 | 50:50 | 50:50 |
| Characteristics of low-dielectric material | α (/__C) | 89 | 93 | 89 | 93 | 88 | 86 | 82 | 79 |
| | d (μm) | 3.0 | 3.1 | 2.9 | 3.0 | 2.9 | 2.8 | 3.1 | 3.2 |
| | ε: (at 1 MHz) | 6.8 | 8.2 | 6.9 | 8.8 | 8.1 | 7.6 | 7.5 | 7.8 |
| | ρ: (logρ Ωcm) | 13.2 | 12.8 | 12.9 | 12.9 | 13.3 | 13.3 | 13.2 | 13.1 |
| | Ts: (__C) | 920 | 910 | 910 | 900 | 900 | 910 | 910 | 890 |
| BCN | 1) Appearance | ○ | ○ | ○ | ○ | ○ | ○ | ○ | del |
| | 2) Cracking | ○ | ⊚ | ○ | ⊚ | ○ | ○ | x | — |
| | 3) Evaluation | ○ | ○ | ○ | ○ | ○ | ○ | x | x |
| BCZCN | 1) Appearance | dam | dam | dam | dam | dam | ○ | ○ | ○ |
| | 2) Cracking | — | — | — | — | — | x | ○ | ⊚ |

TABLE 7-continued

| | | | | | | | | | |
|---|---|---|---|---|---|---|---|---|---|
| BNTG | 3) Evaluation | x | x | x | x | x | x | ○ | ○ |
| | 1) Appearance | ○ | ⊚ | ○ | ⊚ | ○ | ○ | ○ | del |
| | 2) Cracking | ○ | ⊚ | ○ | ⊚ | ○ | ○ | x | — |
| | 3) Evaluation | ○ | ○ | ○ | ○ | ○ | ○ | x | x |

| | Specimen No. | 9 | 10 | 11 | 12 | 13 | 14 | 15 | 16 |
|---|---|---|---|---|---|---|---|---|---|
| Ceramic powder | Forsterite ($Mg_2SiO_4$) | 25 | 25 | 25 | 0 | 0 | 0 | 0 | 0 |
| | Zirconia ($ZrO_2$) | 75 | 25 | 50 | 100 | 75 | 50 | 25 | 0 |
| | Alumina ($Al_2O_3$) | 0 | 50 | 25 | 0 | 25 | 50 | 75 | 100 |
| Amorphous glass | $SiO_2$ | 50 | 50 | 50 | 50 | 50 | 50 | 50 | 50 |
| | $B_2O_3$ | 5 | 5 | 5 | 5 | 5 | 5 | 5 | 5 |
| | $Al_2O_3$ | 5 | 5 | 5 | 5 | 5 | 5 | 5 | 5 |
| | BaO | 20 | 20 | 20 | 20 | 20 | 20 | 20 | 20 |
| | CaO | 20 | 20 | 20 | 20 | 20 | 20 | 20 | 20 |
| | SrO | 0 | 0 | 0 | 0 | 0 | 0 | 0 | 0 |
| | $La_2O_3$ Softening point (°C) | 0 | 0 | 0 | 0 | 0 | 0 | 0 | 0 |
| Weight ratio of ceramic powder: amorphous glass | | 50:50 | 50:50 | 50:50 | 50:50 | 50:50 | 50:50 | 50:50 | 50:50 |
| Characteristics of low-dielectric material | α (/°C) | 96 | 82 | 89 | 93 | 86 | 82 | 78 | 74 |
| | d (μm) | 2.8 | 2.8 | 3.0 | 2.8 | 2.9 | 2.8 | 2.7 | 2.9 |
| | ε: (at 1 MHz) | 9.2 | 8.2 | 9.1 | 10.2 | 9.5 | 9.3 | 8.6 | 8.1 |
| | ρ: (logρ Ωcm) | 13.1 | 12.8 | 13.1 | 12.8 | 12.8 | 12.9 | 13.3 | 13.3 |
| | Ts: (°C) | 890 | 890 | 890 | 890 | 890 | 900 | 890 | 890 |
| BCN | 1) Appearance | ○ | del | ○ | ○ | ○ | ○ | del | del |
| | 2) Cracking | ○ | — | ○ | ⊚ | ○ | x | — | — |
| | 3) Evaluation | ○ | x | ○ | ○ | ○ | x | x | x |
| BCZCN | 1) Appearance | dam | ○ | ○ | dam | ○ | ○ | ○ | ○ |
| | 2) Cracking | — | ○ | x | — | x | ○ | ⊚ | ⊚ |
| | 3) Evaluation | x | ○ | x | x | x | ○ | ○ | ○ |
| BNTG | 1) Appearance | ○ | ○ | ○ | ○ | ○ | ○ | del | del |
| | 2) Cracking | ⊚ | x | ○ | ⊚ | Δ | x | — | — |
| | 3) Evaluation | ○ | x | ○ | ○ | ○ | x | x | x |

α: Thermal expansion coefficient (/°C),
d: Average particle diameter (μm),
ε: Dielectric constant (at 1 MHz),
ρ: Resistivity (logρ Ωcm),
Ts: Sintering temperature (°C)
del: Delaminated,
dam: Damaged,
wav: Waviness,
wrp: Warpage,
nst: Not sintered,
1) Appearance of sintered substance:
x: Delaminated or damaged after sintering,
○: Can be sintered but low interfacial bonding strength,
⊚: Large bonding strength
2) Cracking of substrate:
x: Damaged or many cracks after cutting,
○: Some cracks,
⊚: No occurrence of cracks
3) Overall evaluation:
x: Not acceptable,
○: Good,
⊚: Excellent
Thermal expansion coefficient of high-dielectric material:
BCN: $93 \times 10^{-7}$/°C,
BCZCN: $76 \times 10^{-7}$/°C,
BNTG: $93 \times 10^{-7}$/°C,
Specimen Nos. marked with * show that they fall outside the scope of Claims of the present invention.

Since the alumina content in the low-dielectric material of Specimen No. 6 is higher, causing a reduced thermal expansion coefficient, sintering was also possible with BCZCN but large internal stresses built up, causing damage when released on cutting with the dicer.

Specimen No. 7 has increased alumina content, further reducing the thermal expansion coefficient. No cracks occurred in the cut section when cutting with the dicer after sintering with BCZCN. However, many cracks occurred in the high-dielectric layer when cutting the sintered substance of BCN and BNTG with the dicer. This allows the assumption to be made that cracks caused by large tensile stresses in the high-dielectric layer due to smaller thermal expansion coefficient in the low-dielectric layer than the high-dielectric layer.

When the amount of alumina is farther increased and thermal expansion coefficient falls to $79 \times 10^{-7}$/° C., such as in Specimen No. 8, it cannot be sintered with BCN and BNTG, and complete delamination occurred at the interface (phase boundary). On the other hand, a good sintered substance was achieved with BNTG although it showed somewhat weak bonding strength.

The same tendency as in Specimen Nos. 1 to 8 was seen for Specimen Nos. 9 to 16. When the amount of alumina exceeded 50% and thermal expansion coefficient fell to a low level, sintering with BCZCN became possible, and when the amount of alumina is kept below 50% and thermal expansion coefficient increased to a high level, sintering with BCN and BNTG became possible.

The above results indicate that the amount of alumina contained in ceramic powder mixture containing forsterite, alumina, and zirconia should ideally remain below 50 weight % when the high-dielectric layer is made of BCN or BNTG. If the high-dielectric layer is made of BCZCN, the amount of alumina contained should ideally exceed 50 weight %.

Tenth Exemplary Embodiment

Next, optimum components for the amorphous glass composition of the low-dielectric layer were examined.

Here, BCN was used for the high-dielectric layer. Evaluation method is the same as the second exemplary embodiment. Also, same as specimen No. 1 in Table 7, 100 weight % of forsterite was used as ceramic powder for the low-dielectric layer. Mixing weight ratio of amorphous glass and ceramic powder was 50:50.

Specimen Nos. 1 and 17 to 20 in Table 8A were examined with regard to the ratio of $SiO_2$ and MO (M is Ba and Ca) in amorphous glass. $SiO_2$ is an oxide for forming glass, and, at the same time, it functions as to lower the thermal expansion coefficient of glass. Therefore, if the amount of $SiO_2$ is excessive (Specimen No. 20), the thermal expansion coefficient of the low-dielectric layer decreases and many cracks occur in the high-dielectric layer due to the same reason as described above. If the amount of $SiO_2$ is too little (Specimen No. 17), the thermal expansion coefficient becomes too large and damages the sintered body. Accordingly, the amount of $SiO_2$ should ideally be kept between 40 and 50 weight %.

Specimen Nos. 21 to 24 in Table 8A were examined with regard to the $MO/La_2O_3$ ratio. Amorphous glass of Specimen No. 19 was used as a base, and a part of MO (M is Ba and Ca) was replaced with $La_2O_3$. When the amount of $La_2O_3$ was increased, reactivity of BCN and the low-dielectric material is improved, and bonding strength at the boundary is enhanced, but there was no change in thermal expansion coefficient. If the amount of $La_2O_3$ was excessive, however, reactivity of the low-dielectric layer and BCN became too strong, and waviness occurred in the entire sintered body. According to the results of specimen Nos. 17 to 24, the amount of $(MO+La_2O_3)$ should ideally be kept between 40 and 50 weight % and the amount of $La_2O_3$ should ideally be 15 weight % or below.

In Specimen Nos. 25 to 39 in Table 8A and Table 8B, the optimum ratio of BaO/CaO/SrO was examined, in Specimen Nos. 40 to 42, the optimum ratio of $SiO_2/B_2O_3$ was examined, and in Specimen Nos. 43 to 46, the optimum ratio of $Al_2O_3/SiO_2$ was examined.

TABLE 8

| | Specimen No. | 1 | 17* | 18 | 19 | 20* | 21 | 22 | 23 |
|---|---|---|---|---|---|---|---|---|---|
| Ceramic powder | Forsterite ($Mg_2SiO_4$) | 100 | 100 | 100 | 100 | 100 | 100 | 100 | 100 |
| | Zirconia ($ZrO_2$) | 0 | 0 | 0 | 0 | 0 | 0 | 0 | 0 |
| | Alumina ($Al_2O_3$) | 0 | 0 | 0 | 0 | 0 | 0 | 0 | 0 |
| Amorphous glass | $SiO_2$ | 50 | 35 | 40 | 45 | 55 | 45 | 45 | 45 |
| | $B_2O_3$ | 5 | 5 | 5 | 5 | 5 | 5 | 5 | 5 |
| | $Al_2O_3$ | 5 | 5 | 5 | 5 | 5 | 5 | 5 | 5 |
| | BaO | 20 | 30 | 30 | 25 | 20 | 25 | 25 | 25 |
| | CaO | 20 | 25 | 20 | 20 | 15 | 15 | 10 | 5 |
| | SrO | 0 | 0 | 0 | 0 | 0 | 0 | 0 | 0 |
| | $La_2O_3$ | 0 | 0 | 0 | 0 | 0 | 5 | 10 | 15 |
| | Softening point (_C) | | | | | | | | |
| Weight ratio of ceramic powder: amorphous glass | | 50:50 | 50:50 | 50:50 | 50:50 | 50:50 | 50:50 | 50:50 | 50:50 |
| Characteristics of low-dielectric material | $\alpha$ (/_C) | 89 | 102 | 96 | 93 | 83 | 93 | 93 | 92 |
| | d ($\mu$m) | 3.0 | 2.8 | 2.9 | 3.1 | 3.1 | 3.0 | 3.1 | 2.9 |
| | $\epsilon$: (at 1 MHz) | 6.8 | 7.3 | 7.2 | 7.0 | 6.5 | 7.0 | 7.0 | 6.9 |
| | $\rho$: (log$\rho$ $\Omega$cm) | 13.2 | 12.5 | 12.8 | 13.0 | 13.5 | 13.2 | 13.1 | 13.1 |
| | Ts: (_C) | 920 | 860 | 890 | 900 | 930 | 890 | 890 | 890 |
| BCN | 1) Appearance | ○ | dam | ○ | ○ | ○ | ◎ | ◎ | ◎ |
| | 2) Cracking | ○ | — | ○ | ◎ | x | ◎ | ◎ | ◎ |
| | 3) Evaluation | ○ | x | ○ | ○ | x | ◎ | ◎ | ◎ |

| | Specimen No. | 24* | 25 | 26 | 27 | 28 | 29 | 30 | 31 |
|---|---|---|---|---|---|---|---|---|---|
| Ceramic powder | Forsterite ($Mg_2SiO_4$) | 100 | 100 | 100 | 100 | 100 | 100 | 100 | 100 |
| | Zirconia ($ZrO_2$) | 0 | 0 | 0 | 0 | 0 | 0 | 0 | 0 |
| | Alumina ($Al_2O_3$) | 0 | 0 | 0 | 0 | 0 | 0 | 0 | 0 |
| Amorphous glass | $SiO_2$ | 45 | 45 | 45 | 45 | 45 | 45 | 45 | 45 |
| | $B_2O_3$ | 5 | 5 | 5 | 5 | 5 | 5 | 5 | 5 |
| | $Al_2O_3$ | 5 | 5 | 5 | 5 | 5 | 5 | 5 | 5 |
| | BaO | 25 | 40 | 35 | 30 | 20 | 10 | 5 | 0 |
| | CaO | 0 | 0 | 5 | 10 | 20 | 30 | 35 | 40 |
| | SrO | 0 | 0 | 0 | 0 | 0 | 0 | 0 | 0 |
| | $La_2O_3$ | 20 | 5 | 5 | 5 | 5 | 5 | 5 | 5 |
| | Softening point (_C) | | | | | | | | |
| Weight ratio of ceramic powder: amorphous glass | | 50:50 | 50:50 | 50:50 | 50:50 | 50:50 | 50:50 | 50:50 | 50:50 |

TABLE 8-continued

| | | | | | | | | | |
|---|---|---|---|---|---|---|---|---|---|
| Characteristics of low-dielectric material | $\alpha$ (/°C) | 92 | 87 | 89 | 91 | 94 | 96 | 100 | 102 |
| | d (μm) | 2.8 | 2.8 | 2.9 | 3.2 | 3.1 | 2.8 | 3.2 | 3.1 |
| | $\epsilon$: (at 1 MHz) | 7.1 | 7.1 | 7.2 | 7.1 | 7.0 | 6.9 | 6.9 | 6.9 |
| | ρ: (logρ Ωcm) | 13.2 | 13.2 | 13.5 | 12.8 | 12.8 | 13.2 | 13.3 | 13.4 |
| | Ts: (°C) | 880 | 900 | 900 | 890 | 890 | 890 | 880 | 880 |
| BCN | 1) Appearance | wav | ○ | ⊚ | ⊚ | ⊚ | ○ | ○ | ○ |
| | 2) Cracking | — | ○ | ⊚ | ⊚ | ○ | ○ | x | x |
| | 3) Evaluation | x | ○ | ⊚ | ⊚ | ○ | ○ | x | x |

| | Specimen No. | 32 | 33 | 34 | 35 | 36 | 37 | 38 | 39 |
|---|---|---|---|---|---|---|---|---|---|
| Ceramic powder | Forsterite (Mg$_2$SiO$_4$) | 100 | 100 | 100 | 100 | 100 | 100 | 100 | 100 |
| | Zirconia (ZrO$_2$) | 0 | 0 | 0 | 0 | 0 | 0 | 0 | 0 |
| | Alumina (Al$_2$O$_3$) | 0 | 0 | 0 | 0 | 0 | 0 | 0 | 0 |
| Amorphous glass | SiO$_2$ | 45 | 45 | 45 | 45 | 45 | 45 | 45 | 45 |
| | B$_2$O$_3$ | 5 | 5 | 5 | 5 | 5 | 5 | 5 | 5 |
| | Al$_2$O$_3$ | 5 | 5 | 5 | 5 | 5 | 5 | 5 | 5 |
| | BaO | 0 | 10 | 20 | 30 | 35 | 0 | 0 | 0 |
| | CaO | 0 | 0 | 0 | 0 | 0 | 10 | 20 | 30 |
| | SrO | 40 | 30 | 20 | 10 | 5 | 30 | 20 | 10 |
| | La$_2$O$_3$ | 5 | 5 | 5 | 5 | 5 | 5 | 5 | 5 |
| | Softening point (°C) | | | | | | | | |
| Weight ratio of ceramic powder: amorphous glass | | 50:50 | 50:50 | 50:50 | 50:50 | 50:50 | 50:50 | 50:50 | 50:50 |
| Characteristics of low-dielectric material | $\alpha$ (/°C) | 80 | 82 | 83 | 87 | 89 | 83 | 85 | 91 |
| | d (μm) | 2.9 | 3.2 | 2.9 | 2.9 | 2.8 | 2.8 | 2.9 | 2.9 |
| | $\epsilon$: (at 1 MHz) | 7.2 | 7.1 | 7.1 | 7.2 | 7.1 | 7.2 | 7.2 | 7.1 |
| | ρ: (logρ Ωcm) | 13.2 | 12.5 | 12.7 | 12.2 | 12.8 | 12.7 | 12.9 | 12.9 |
| | Ts: (°C) | 860 | 880 | 880 | 890 | 890 | 880 | 880 | 880 |
| BCN | 1) Appearance | del | del | del | ○ | ⊚ | del | del | ⊚ |
| | 2) Cracking | — | — | — | ○ | ○ | — | — | ⊚ |
| | 3) Evaluation | x | x | x | ○ | ○ | x | x | ⊚ |

| | Specimen No. | 40 | 41* | 42 | 43 | 44 | 45* | 46 |
|---|---|---|---|---|---|---|---|---|
| Ceramic powder | Forsterite (Mg$_2$SiO$_4$) | 100 | 100 | 100 | 100 | 100 | 100 | 100 |
| | Zirconia (ZrO$_2$) | 0 | 0 | 0 | 0 | 0 | 0 | 0 |
| | Alumina (Al$_2$O$_3$) | 0 | 0 | 0 | 0 | 0 | 0 | 0 |
| Amorphous glass | SiO$_2$ | 40 | 35 | 50 | 40 | 35 | 30 | 50 |
| | B$_2$O$_3$ | 10 | 15 | 0 | 5 | 5 | 5 | 5 |
| | Al$_2$O$_3$ | 5 | 5 | 5 | 10 | 15 | 20 | 0 |
| | BaO | 25 | 25 | 25 | 25 | 25 | 25 | 25 |
| | CaO | 10 | 10 | 10 | 10 | 10 | 10 | 10 |
| | SrO | 0 | 0 | 0 | 0 | 0 | 0 | 0 |
| | La$_2$O$_3$ | 0 | 0 | 0 | 0 | 0 | 0 | 0 |
| | Softening point (°C) | | | | | | | |
| Weight ratio of ceramic powder: amorphous glass | | 50:50 | 50:50 | 50:50 | 50:50 | 50:50 | 50:50 | 50:50 |
| Characteristics of low-dielectric material | $\alpha$ (/°C) | 93 | 92 | 95 | 94 | 95 | 98 | 90 |
| | d (μm) | 2.9 | 2.9 | 2.8 | 2.9 | 2.9 | 2.9 | 3.1 |
| | $\epsilon$: (at 1 MHz) | 6.9 | 7.2 | 6.8 | 7.3 | 7.3 | 7.4 | 6.9 |
| | ρ: (logρ Ωcm) | 12.8 | 12.8 | 12.9 | 12.9 | 12.8 | 12.8 | 13.2 |
| | Ts: (°C) | 890 | 850 | 910 | 890 | 890 | 890 | 900 |
| BCN | 1) Appearance | ○ | wav | ○ | ○ | ○ | ○ | ○ |
| | 2) Cracking | ⊚ | — | ⊚ | ⊚ | ○ | x | ⊚ |
| | 3) Evaluation | ○ | x | ○ | ○ | ○ | x | ○ |

$\alpha$: Thermal expansion coefficient (/°C),
d: Average particle diameter (μm),
$\epsilon$: Dielectric constant (at 1 MHz),
ρ: Resistivity (logρ Ωcm),
Ts: Sintering temperature (°C)
del: Delaminated,
dam: Damaged,
wav: Waviness,
wrp: Warpage,
nst: Not sintered,
1) Appearance of sintered substance:
x: Delaminated or damaged after sintering,
○: Can be sintered but low interfacial bonding strength,
⊚: Large bonding strength
2) Cracking of substrate:
x: Damaged or many cracks after cutting,
○: Some cracks,
⊚: No occurrence of cracks TABLE 8-continued 3) Overall evaluation:
x: Not acceptable,
o: Good,
⊚: Excellent
Thermal expansion coefficient of high-dielectric material:
BCN: 93 × $10^{-7}$/_C,
BCZCN: 76 × $10^{-7}$/_C,
BNTG: 93 × $10^{-7}$/_C,
Specimen Nos. marked with * show that they fall outside the scope of Claims of the present invention.

According to the results of Specimen Nos. 25 to 39, BaO should ideally be 10 to 40 weight %, CaO is 0 to 30 weight %, and SrO is 0 to 10 weight %. When the amount of BaO and SrO is increased, the material will have lower thermal expansion, and when the content of CaO is increased, the material will have higher thermal expansion.

According to the results of Specimen Nos. 40 to 42, the amount of $B_2O_3$ should ideally be 0 to 10 weight %. When $B_2O_3$ exceeds 10 weight %, glass softening point decreases too much, and causes strong reactivity with the high-dielectric layer, resulting in waviness of the sintered body.

According to the results of Specimen Nos. 43 to 46, the amount of $Al_2O_3$ should ideally be 0 to 15 weight % because when it exceeds 15 weight %, the thermal expansion becomes too large and causes cracks in the high-dielectric layer.

The present invention is not limited to the third exemplary embodiment. Other components such as $SnO_2$, $P_2O_5$, and $K_2O$ can be added to amorphous glass of the low-dielectric layer.

Eleventh Exemplary Embodiment

Next, the mixing weight ratio of amorphous glass and ceramic powder was examined. The composition of Specimen No. 21 was employed as the composition of amorphous glass according to the results of the tenth exemplary embodiment.

Specimen Nos. 21 and 47 to 52 in Table 9 uses forsterite as ceramic powder, and the mixing weight ratio of forsterite and amorphous glass was changed for examination. Specimen Nos. 53 to 59 use alumina as ceramic powder and specimen Nos. 60 and 61 show results when zirconia is used.

In any ceramic powder, sintering performance of the low-dielectric layer material drops when the mixing weight ratio of ceramic powder becomes large. When the mixing weight ratio of ceramic powder and amorphous glass reaches 75:25, the low-dielectric layer material cannot be sintered even at 950° C., causing degradation in insulation resistance. If the material is sintered at higher temperature, it became impossible to sinter with silver.

On the other hand, if the mixing ratio of amorphous glass increases, sintering performance improved but reactivity with the high-dielectric layer became too strong when the mixing ratio reaches 25:75, causing warpage or waviness of the sintered body.

Based on the above results, the mixing weight ratio of ceramic powder and amorphous glass should ideally be between 30:70 and 70:30.

TABLE 9

| | Specimen No. | 21 | 47 | 48 | 49* | 50 | 51 | 52* | 53* |
|---|---|---|---|---|---|---|---|---|---|
| Ceramic powder | Forsterite ($Mg_2SiO_4$) | 100 | 100 | 100 | 100 | 100 | 100 | 100 | 0 |
| | Zirconia ($ZrO_2$) | 0 | 0 | 0 | 0 | 0 | 0 | 0 | 0 |
| | Alumina ($Al_2O_3$) | 0 | 0 | 0 | 0 | 0 | 0 | 0 | 100 |
| Amorphous glass | $SiO_2$ | 45 | 45 | 45 | 45 | 45 | 45 | 45 | 45 |
| | $B_2O_3$ | 5 | 5 | 5 | 5 | 5 | 5 | 5 | 5 |
| | $Al_2O_3$ | 5 | 5 | 5 | 5 | 5 | 5 | 5 | 5 |
| | BaO | 25 | 25 | 25 | 25 | 25 | 25 | 25 | 25 |
| | CaO | 15 | 15 | 15 | 15 | 15 | 15 | 15 | 15 |
| | SrO | 0 | 0 | 0 | 0 | 0 | 0 | 0 | 0 |
| | $La_2O_3$ | 5 | 5 | 5 | 5 | 5 | 5 | 5 | 5 |
| | Softening point (_C) | | | | | | | | |
| Weight ratio of ceramic powder: amorphous glass | | 50:50 | 40:60 | 30:70 | 25:75 | 60:40 | 70:30 | 75:25 | 75:25 |
| Characteristics of low-dielectric material | α (/_C) | 93 | 92 | 93 | 92 | 92 | 93 | 93 | 76 |
| | d (μm) | 3.0 | 2.9 | 2.9 | 3.1 | 2.9 | 2.9 | 2.8 | 3.2 |
| | ε: (at 1 MHz) | 7.0 | 7.2 | 7.4 | 7.5 | 6.9 | 6.4 | 5.9 | 6.8 |
| | ρ: (logρ Ωcm) | 13.2 | 13.1 | 13.3 | 13.3 | 12.5 | 11.6 | 10.5 | 9.8 |
| | Ts: (_C) | 890 | 870 | 860 | 850 | 910 | 950 | 950 | 950 |
| BCN | 1) Appearance | ⊚ | ⊚ | o | wrp | ⊚ | o | nst | del |
| | 2) Cracking | ⊚ | ⊚ | ⊚ | — | ⊚ | ⊚ | ⊚ | — |
| | 3) Evaluation | ⊚ | ⊚ | ⊚ | x | ⊚ | o | x | x |
| BCZCN | 1) Appearance | dam | dam | dam | dam | dam | dam | dam | nst |
| | 2) Cracking | — | — | — | — | — | — | — | ⊚ |
| | 3) Evaluation | x | x | x | x | x | x | x | x |
| BNTG | 1) Appearance | ⊚ | ⊚ | o | wrp | o | o | nst | del |
| | 2) Cracking | ⊚ | ⊚ | ⊚ | — | ⊚ | ⊚ | ⊚ | — |
| | 3) Evaluation | ⊚ | ⊚ | ⊚ | x | o | o | x | x |

TABLE 9-continued

| | Specimen No. | 54 | 55 | 56 | 57 | 58 | 59 | 60 | 61 |
|---|---|---|---|---|---|---|---|---|---|
| Ceramic powder | Forsterite ($Mg_2SiO_4$) | 0 | 0 | 0 | 0 | 0 | 0 | 0 | 0 |
| | Zirconia ($ZrO_2$) | 0 | 0 | 0 | 0 | 0 | 0 | 100 | 100 |
| | Alumina ($Al_2O_3$) | 100 | 100 | 100 | 100 | 100 | 100 | 0 | 0 |
| Amorphous glass | $SiO_2$ | 45 | 45 | 45 | 45 | 45 | 45 | 45 | 45 |
| | $B_2O_3$ | 5 | 5 | 5 | 5 | 5 | 5 | 5 | 5 |
| | $Al_2O_3$ | 5 | 5 | 5 | 5 | 5 | 5 | 5 | 5 |
| | BaO | 25 | 25 | 25 | 25 | 25 | 25 | 25 | 25 |
| | CaO | 15 | 15 | 15 | 15 | 15 | 15 | 15 | 15 |
| | SrO | 0 | 0 | 0 | 0 | 0 | 0 | 0 | 0 |
| | $La_2O_3$ | 5 | 5 | 5 | 5 | 5 | 5 | 5 | 5 |
| | Softening point (_C) | | | | | | | | |
| Weight ratio of ceramic powder: amorphous glass | | 70:30 | 60:40 | 50:50 | 40:60 | 30:70 | 25:75 | 70:30 | 30:70 |
| Characteristics of low-dielectric material | α (/_C) | 76 | 76 | 77 | 77 | 77 | 77 | 94 | 95 |
| | d (μm) | 3.3 | 3.2 | 3.3 | 3.1 | 3.2 | 3.2 | 2.7 | 2.9 |
| | ε: (at 1 MHz) | 7.6 | 8.1 | 8.0 | 7.9 | 7.9 | 7.9 | 8.2 | 8.4 |
| | ρ: (logρ Ωcm) | 11.1 | 12.1 | 12.8 | 13.1 | 13.1 | 13.3 | 13.3 | 13.3 |
| | Ts: (_C) | 950 | 920 | 900 | 880 | 870 | 850 | 950 | 860 |
| BCN | 1) Appearance | del | del | del | del | del | del | ○ | ⊚ |
| | 2) Cracking | — | — | — | — | — | — | ⊚ | ⊚ |
| | 3) Evaluation | x | x | x | x | x | x | ○ | ⊚ |
| BCZCN | 1) Appearance | ○ | ○ | ⊚ | ⊚ | ⊚ | wav | dam | dam |
| | 2) Cracking | ⊚ | ⊚ | ⊚ | ⊚ | ⊚ | — | — | — |
| | 3) Evaluation | ○ | ○ | ⊚ | ⊚ | ⊚ | x | x | x |
| BNTG | 1) Appearance | del | del | del | del | del | del | ○ | ⊚ |
| | 2) Cracking | — | — | — | — | — | — | ⊚ | ⊚ |
| | 3) Evaluation | x | x | x | x | x | x | ○ | ⊚ |

α: Thermal expansion coefficient (/_C),
d: Average particle diameter (μm),
ε: Dielectric constant (at 1 MHz),
ρ: Resistivity (logρ Ωcm),
Ts: Sintering temperature (_C)
del: Delaminated,
dam: Damaged,
wav: Waviness,
wrp: Warpage,
nst: Not sintered,
1) Appearance of sintered substance:
x: Delaminated or damaged after sintering,
○: Can be sintered but low interfacial bonding strength,
⊚: Large bonding strength
2) Cracking of substrate:
x: Damaged or many cracks after cutting,
○: Some cracks,
⊚: No occurrence of cracks
3) Overall evaluation:
x: Not acceptable,
○: Good,
⊚: Excellent
Thermal expansion coefficient of high-dielectric material:
BCN: $93 \times 10^{-7}$/_C,
BCZCN: $76 \times 10^{-7}$/_C,
BNTG: $93 \times 10^{-7}$/_C,
Specimen Nos. marked with * show that they fall outside the scope of Claims of the present invention.

Twelfth Exemplary Embodiment

Next, the effect of average ground particle diameter of the low-dielectric material to low temperature sintering of the low-dielectric material was examined.

Specimen No. 51 in Table 9 can finally be sintered at 950° C., the limit temperature for sintering with silver, when the mixing weight ratio of ceramic powder (forsterite) and amorphous glass is 70:30. Specimen Nos. 63 and 64 in Table 10 show results of grinding this low-dielectric material longer for reducing the average particle diameter to achieve sintering at lower temperature. When the average ground particle diameter of the low-dielectric material is 2.0 μm or below, sintering temperature fell more than 20° C. Those compositions, such as Specimen No. 51, with somewhat lower sintering performance can also secure more than 30° C. difference with melting temperature (about 960° C.) of silver. Accordingly, partial melting of silver electrode or degradation in conductivity can be prevented.

Thus, the average particle diameter of the low-dielectric material should ideally be 2.0 μm or below.

TABLE 10

| | Specimen No. | 51 | 63 | 64 | 65 | 66 | 67* | 68 | 69 | 70* | 71 | 72 | 73* |
|---|---|---|---|---|---|---|---|---|---|---|---|---|---|
| Ceramic powder | Forsterite ($Mg_2SiO_4$) | 100 | 100 | 100 | 100 | 100 | 100 | 100 | 100 | 100 | 100 | 100 | 100 |
| | Zirconia ($ZrO_2$) | 0 | 0 | 0 | 0 | 0 | 0 | 0 | 0 | 0 | 0 | 0 | 0 |
| | Alumina ($Al_2O_3$) | 0 | 0 | 0 | 0 | 0 | 0 | 0 | 0 | 0 | 0 | 0 | 0 |
| Amorphous glass | $SiO_2$ | 45 | 45 | 45 | 45 | 45 | 45 | 45 | 45 | 45 | 45 | 45 | 45 |
| | $B_2O_3$ | 5 | 5 | 5 | 5 | 5 | 5 | 5 | 5 | 5 | 5 | 5 | 5 |
| | $Al_2O_3$ | 5 | 5 | 5 | 5 | 5 | 5 | 5 | 5 | 5 | 5 | 5 | 5 |
| | BaO | 25 | 25 | 25 | 25 | 25 | 25 | 25 | 25 | 25 | 25 | 25 | 25 |
| | CaO | 15 | 15 | 15 | 15 | 15 | 15 | 15 | 15 | 15 | 15 | 15 | 15 |
| | SrO | 0 | 0 | 0 | 0 | 0 | 0 | 0 | 0 | 0 | 0 | 0 | 0 |
| | $La_2O_3$ | 5 | 5 | 5 | 5 | 5 | 5 | 5 | 5 | 5 | 5 | 5 | 5 |
| | Softening point (_C) | | | | | | | | | | | | |
| Weight ratio of ceramic powder: amorphous glass | | 70:30 | 70:30 | 70:30 | 70:30 | 70:30 | 70:30 | 70:30 | 70:30 | 70:30 | 70:30 | 70:30 | 70:30 |
| | $SiO_2$ | — | — | — | 0.05 | 2.0 | 3.0 | — | — | — | — | — | — |
| | CuO | — | — | — | — | — | — | 0.05 | 2.0 | 3.0 | — | — | — |
| | $MnO_2$ | — | — | — | — | — | — | — | — | — | 0.05 | 2.0 | 3.0 |
| Characteristics of low-dielectric material | α (/_C) | 93 | 93 | 93 | 93 | 91 | 91 | 93 | 93 | 93 | 93 | 93 | 93 |
| | d (μm) | 2.9 | 2.0 | 1.5 | 3.0 | 3.1 | 2.9 | 2.9 | 2.8 | 2.9 | 3.1 | 2.8 | 3.1 |
| | ε: (at 1 MHz) | 6.4 | 7.1 | 7.1 | 6.9 | 6.9 | 6.8 | 7.0 | 7.0 | 7.1 | 7.1 | 7.3 | 7.3 |
| | ρ: (logρ Ωcm) | 11.6 | 13.2 | 13.2 | 12.8 | 12.8 | 12.4 | 12.8 | 12.1 | 10.8 | 12.7 | 12.5 | 11.2 |
| | Ts: (_C) | 950 | 930 | 920 | 940 | 930 | 920 | 920 | 920 | 910 | 930 | 930 | 930 |
| BCN | 1) Appearance | ○ | ⊚ | ⊚ | ⊚ | ⊚ | wav | ⊚ | ⊚ | ⊚ | ○ | ⊚ | ⊚ |
| | 2) Cracking | ⊚ | ⊚ | ⊚ | ⊚ | ⊚ | — | ⊚ | ⊚ | ⊚ | ⊚ | ⊚ | ⊚ |
| | 3) Evaluation | ○ | ⊚ | ⊚ | ⊚ | ⊚ | x | ⊚ | ⊚ | ⊚ | ○ | ⊚ | ⊚ |
| BNTG | 1) Appearance | ○ | ⊚ | ⊚ | ⊚ | ⊚ | wav | ⊚ | ⊚ | ⊚ | ⊚ | ⊚ | ⊚ |
| | 2) Cracking | ⊚ | ⊚ | ⊚ | ⊚ | ⊚ | — | ⊚ | ⊚ | ⊚ | ⊚ | ⊚ | ⊚ |
| | 3) Evaluation | ○ | ⊚ | ⊚ | ⊚ | ⊚ | x | ⊚ | ⊚ | ⊚ | ⊚ | ⊚ | ⊚ |

α: Thermal expansion coefficient (/_C),
d: Average particle diameter (μm),
ε: Dielectric constant (at 1 MHz),
ρ: Resistivity (logρ Ωcm),
Ts: Sintering temperature (_C)
del: Delaminated,
dam: Damaged,
wav: Waviness,
wrp: Warpage,
nst: Not sintered,
1) Appearance of sintered substance:
x: Delaminated or damaged after sintering,
○: Can be sintered but low interfacial bonding strength,
⊚: Large bonding strength
2) Cracking of substrate:
x: Damaged or many cracks after cutting,
○: Some cracks,
⊚: No occurrence of cracks
3) Overall evaluation:
x: Not acceptable,
○: Good,
⊚: Excellent
Thermal expansion coefficient of high-dielectric material:
BCN: $93 \times 10^{-7}$/_C,
BCZCN: $76 \times 10^{-7}$/_C,
BNTG: $93 \times 10^{-7}$/_C,
Specimen Nos. marked with * show that they fall outside the scope of Claims of the present invention.

Thirteenth Exemplary Embodiment

Next, the effect of subcomponent added to the low-dielectric material to lower sintering temperature of the low-dielectric material was examined.

Specimen Nos. 65 to 67 in Table 10 show results of evaluation when silicon dioxide ($SiO_2$) is added as subcomponent, and Specimen Nos. 68 to 70 are when copper oxide (CuO) is added, and Specimen Nos. 71 to 73 are when manganese dioxide ($MnO_2$) is added.

In any subcomponent, sintering temperature dropped more than 20° C., and showed good effect on low-temperature sintering. However, when silicon dioxide is used as subcomponent, waviness occurred in the sintered body when it was added for 3.0 weight %. When copper oxide or manganese dioxide was added for 3.0 weight %, insulation resistance of the low-dielectric material degraded, and became $1\times10^{12}$ (Ωcm) or below.

According to the above results, silicon dioxide, copper oxide, or manganese dioxide should ideally be added for 0.05 to 2.0 weight % as subcomponent.

Accordingly, the low-dielectric material of the diplexer of the present invention can be sintered with the dielectric ceramic material of BCN, BCZCN, or BNTG for high-dielectric micro wave by mixing amorphous glass and ceramic powder. This prevents delamination at bonding interface of different materials of the sintered body and cracking in each layer, offering the diplexer with higher reliability and stability.

INDUSTRIAL APPLICABILITY

The present invention offers a simple circuit configuration of a diplexer comprising a low-pass filter, band-pass filter, and matching circuit; and facilitates the setting of the low-pass filter without affecting the passband of the band-pass filter.

Moreover, the present invention enables the reduction of the size of the diplexer by forming the low-dielectric layer and high-dielectric layer. The low-pass filter and the matching circuit of the low-pass filter are formed in the low-dielectric layer, and the band-pass filter and matching circuit of the band-pass filter are formed in the high-dielectric layer.

Furthermore, the present invention offers a diplexer with high reliability and stability which prevents delamination or cracking by optimizing the material composition of the high-dielectric layer and the low-dielectric layer.

Reference Numerals 101 first capacitor
102 first inductor
103 second capacitor
104 third capacitor
105 second inductor
106 fourth capacitor
107 first quarter wavelength resonator
108 fifth capacitor
109 third inductor
110 second quarter wavelength resonator
111 sixth capacitor
112 first terminal
113 common terminal
114 second terminal
115 low-pass filter
116 band-pass filter

What is claimed is:

1. A diplexer separating a signal into two frequency bands, comprising:
   a first terminal, a second terminal, and a common terminal;
   a low-pass filter, coupled between said first terminal and said common terminal, whose passband is a first band,
   a band-pass filter, coupled between said common terminal and said second terminal, whose passband is a second band which is higher in frequency than said first band;
   a first matching circuit, coupled between said low-pass filter and said common terminal, for raising impedance of said first matching circuit in said second band; and
   a second matching circuit, coupled between said common terminal and said band-pass filter, for raising impedance of said second matching circuit in said first band,
   wherein at least two layers of a high-dielectric layer and low-dielectric layer are laminated, said band-pass filter and said second matching circuit are formed in said high-dielectric layer, and said low-pass filter and said first matching circuit are formed in said low-dielectric layer.

2. A diplexer as defined in claim 1, wherein a resonator electrode and capacitor electrode form said band-pass filter, a capacitor electrode for forming said second matching circuit is disposed in a high-dielectric layer; an inductor electrode and capacitor electrode forms said low-pass filter, an inductor electrode for forming said first matching circuit is disposed in said low-pass filter; and a common shield electrode for said band-pass filter and said low-pass filter is disposed on an interface between said high-dielectric layer and said low-dielectric layer.

3. A diplexer as defined in claim 1, wherein a resonator electrode, capacitor electrode, and shield electrode form said band-pass filter, a capacitor electrode for forming said second matching circuit is disposed in a high-dielectric layer; and an inductor electrode, capacitor electrode, and shield electrode form said low-pass filter, and an inductor electrode for forming said first matching circuit is disposed in a low-dielectric layer.

4. A diplexer as defined in claim 1, wherein said low-dielectric layer is composed of ceramic powder of at least one of forsterite ($Mg_2SiO_4$), zirconia ($ZrO_2$), and alumina ($Al_2O_3$), and amorphous glass.

5. A diplexer as defined in claim 4, wherein a mixing weight ratio of said ceramic powder and said amorphous glass is between 30:70 and 70:30.

6. A diplexer as defined in claim 4, wherein said amorphous glass of said low-dielectric layer includes $SiO_2$—$Al_2O_3$—MO(M is at least one of Ba, Ca, and Sr)—$La_2O_3$—$B_2O_3$.

7. A diplexer as defined in claim 6, wherein major components of said amorphous glass includes 40 to 50 weight % of $SiO_2$, 0 to 15 weight % of $Al_2O_3$, 0 to 10 weight % of $B_2O_3$, and 40 to 50 weight % of MO (M is at least one of Ba, Ca, and Sr)+$La_2O_3$, and 0 to 15 weight % of $La_2O_3$.

8. A diplexer as defined in claim 6, wherein 0.05 to 2.0 weight % converting into $SiO_2$, CuO and $MnO_2$ of at least one of silicone oxide, copper oxide, or manganese oxide is added as a sub-component of said low-dielectric layer when the total amount of said ceramic powder and amorphous glass is 100 weight %.

9. A diplexer as defined in claim 1, wherein said high-dielectric layer is a dielectric ceramic material which includes $Bi_2O_3$, CaO, and $Nb_2O_5$.

10. A diplexer as defined in claim 1, wherein said high-dielectric layer is a dielectric ceramic material which includes $Bi_2O_3$, CaO, ZnO, CuO, and $Nb_2O_5$.

11. A diplexer as defined in claim 1, wherein said high-dielectric layer is a dielectric ceramic material which includes BaO, $Nd_2O_5$, $TiO_2$, and glass.

12. A diplexer as defined in claim 11, wherein said dielectric ceramic material comprising a first component which can be defined by a general formula as $xBaO$—$yNd_2O_5$—$zTiO_2$—$wBi_2O_3$ (x+y+z+w=1), said x, y, z, and w are respectively within $0.1 \leq x \leq 0.2$, $0.1 \leq y \leq 0.2$, $0.55 \leq z \leq 0.8$, and $0.005 \leq w \leq 0.05$; and a second component which is a glass at least containing $SiO_2$, $Al_2O_3$, MO (M is at least one of Ba, Ca, and Sr), $La_2O_3$, and $B_2O_3$; and said second component accounting for between 3 weight % and 50 weight % against 100 weight % of said first component.

13. A diplexer as defined in claim 12, wherein glass component of said second component comprising 40 to 50 weight % of $SiO_2$, 0 to 15 weight % of $Al_2O_3$, 0 to 10 weight % of $B_2O_3$, and 40 to 50 weight % of MO (M is at least one of Ba, Ca, and Sr)+$La_2O_3$, and 0 to 15 weight % of $La_2O_3$.

14. A diplexer as defined in claim 12, wherein copper oxide converting into CuO is added as a subcomponent accounting for less than 5 weight % against 100 weight % of said first component.

* * * * *